US012708048B2

(12) United States Patent
Hsiao et al.

(10) Patent No.: US 12,708,048 B2
(45) Date of Patent: Aug. 11, 2026

(54) INTERCONNECT STRUCTURE FOR FRONT-TO-FRONT STACKED CHIPS

(71) Applicant: Taiwan Semiconductor Manufacturing Company, Ltd., Hsin-Chu (TW)

(72) Inventors: Tsung-Chieh Hsiao, Changhua County (TW); Yi Ling Liu, Hsinchu City (TW); Ke-Gang Wen, Hsinchu (TW); Yu-Bey Wu, Hsinchu (TW); Liang-Wei Wang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 406 days.

(21) Appl. No.: 18/404,376

(22) Filed: Jan. 4, 2024

(65) Prior Publication Data

US 2025/0046756 A1 Feb. 6, 2025

Related U.S. Application Data

(60) Provisional application No. 63/609,980, filed on Dec. 14, 2023, provisional application No. 63/517,225, filed on Aug. 2, 2023.

(51) Int. Cl.
*H10W 90/00* (2026.01)
*H10B 80/00* (2026.01)
(Continued)

(52) U.S. Cl.
CPC .......... *H10W 90/00* (2026.01); *H10W 20/20* (2026.01); *H10W 42/00* (2026.01);
(Continued)

(58) Field of Classification Search
CPC . H10W 70/685; H10W 20/20; H10W 20/023; H10W 20/0234; H10W 20/0242;
(Continued)

(56) References Cited

U.S. PATENT DOCUMENTS

2008/0142990 A1* 6/2008 Yu .......................... H10D 84/038 438/109
2010/0155932 A1* 6/2010 Gambino ................ G06F 30/39 257/713

(Continued)

FOREIGN PATENT DOCUMENTS

CN 102024782 A 4/2011
TW 202310210 A 3/2023

*Primary Examiner* — Mohsen Ahmadi
(74) *Attorney, Agent, or Firm* — HAYNES AND BOONE, LLP

(57) ABSTRACT

Interconnect structures for front-to-front stacked chips/dies and methods of fabrication thereof are disclosed herein. An exemplary system on integrated circuit (SoIC) includes a first die that is front-to-front bonded with a second die, for example, by bonding a first topmost metallization layer of a first frontside multilayer interconnect of the first die to a second topmost metallization layer of a second frontside multilayer interconnect of the second die. A through via extends partially through the first frontside multilayer interconnect of the first die, through a device layer of the first die, through a backside power rail of the first die, and through a carrier substrate. The backside power rail is between the carrier substrate and the device layer, and the backside power rail may be a portion of a backside multilayer interconnect of the first die. The through via may be connected to a redistribution layer (RDL) structure.

20 Claims, 28 Drawing Sheets

(51) Int. Cl.

| | |
|---|---|
| ***H10W 20/20*** | (2026.01) |
| ***H10W 20/40*** | (2026.01) |
| ***H10W 20/41*** | (2026.01) |
| ***H10W 20/42*** | (2026.01) |
| ***H10W 42/00*** | (2026.01) |
| ***H10W 70/685*** | (2026.01) |
| ***H10W 72/00*** | (2026.01) |
| ***H10W 74/10*** | (2026.01) |
| ***H10W 90/20*** | (2026.01) |
| *H10W 74/00* | (2026.01) |

(52) U.S. Cl.
CPC ........ *H10W 70/685* (2026.01); *H10W 74/114* (2026.01); *H10W 74/00* (2026.01); *H10W 90/297* (2026.01); *H10W 90/734* (2026.01); *H10W 90/792* (2026.01)

(58) Field of Classification Search
CPC ......... H10W 20/0245; H10W 20/2134; H10W 20/40; H10W 20/427; H10W 20/481; H10W 90/00; H10W 90/297; H10W 90/734; H10W 90/792; H10W 74/00; H10W 74/114; H10W 42/00
See application file for complete search history.

(56) References Cited

U.S. PATENT DOCUMENTS

2013/0009321 A1* 1/2013 Kagawa .............. H10W 20/084 438/455
2015/0021785 A1* 1/2015 Lin ....................... H10W 90/00 438/459
2015/0294955 A1* 10/2015 Chen ..................... H10W 90/00 257/777

* cited by examiner

INTERCONNECT STRUCTURE FOR FRONT-TO-FRONT STACKED CHIPS

This is a non-provisional application of and claims benefit of U.S. Provisional Patent Application Ser. No. 63/517,225, filed Aug. 2, 2023, and U.S. Provisional Patent Application Ser. No. 63/609,980, filed Dec. 14, 2023, the entire disclosures of which are incorporated herein by reference.

BACKGROUND

Advanced IC packaging technologies have been developed to further reduce density and/or improve performance of integrated circuits (ICs), which are incorporated into many electronic devices. For example, IC packaging has evolved, such that multiple ICs may be vertically stacked in three-dimensional ("3D") packages or 2.5D packages (e.g., packages that implement an interposer). Although existing IC packaging and interconnection structures thereof have been generally adequate for their intended purposes, they have not been entirely satisfactory in all respects as IC feature dimensions decrease with scaling IC technology nodes.

BRIEF DESCRIPTION OF THE DRAWINGS

The present disclosure is best understood from the following detailed description when read with the accompanying figures. It is emphasized that, in accordance with standard practice in the industry, various features are not drawn to scale and are used for illustration purposes only. Dimensions of the various features may be arbitrarily increased or reduced for clarity of discussion.

DETAILED DESCRIPTION

Figure 1:
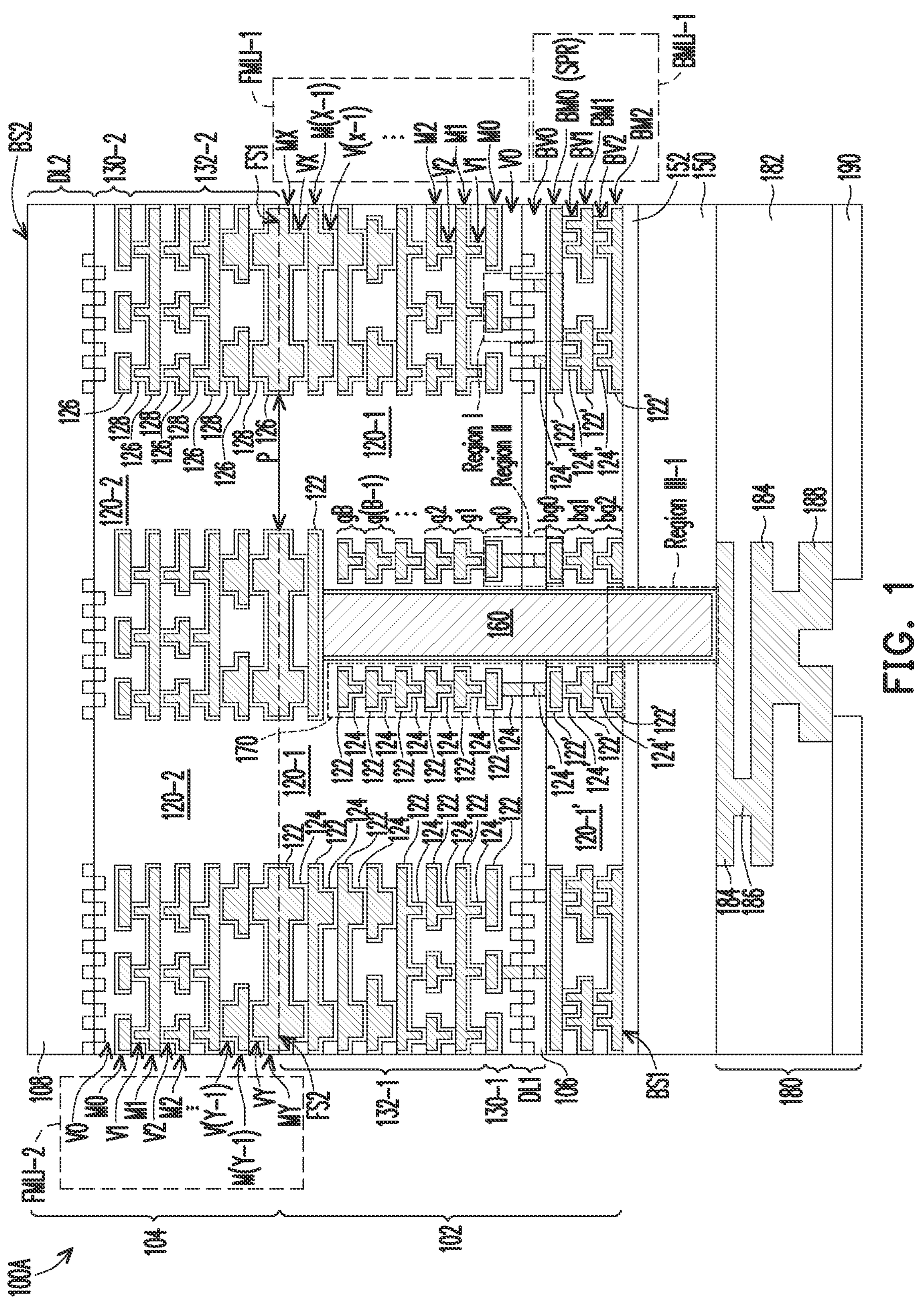
FIG. 1 is a cross-sectional view of a stacked chip structure, in portion or entirety, having an interconnect structure according to various aspects of the present disclosure.

The present disclosure relates generally to integrated circuit (IC) packaging, and more particularly, to improved interconnect structures for front-to-front stacked chips.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first feature and the second feature are formed in direct contact and may also include embodiments in which additional features may be formed between the first feature and the second feature, such that the first feature and the second feature may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure to describe one feature's relationship to another feature. The spatially relative terms are intended to cover different orientations of the device including the features.

Furthermore, when a number or a range of numbers is described with "about," "approximate," "substantially," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.5 nm to 5.5 nm where manufacturing tolerances associated with depositing the material layer are known to be +/−10% by one of ordinary skill in the art. In another example, two features described as having "substantially the same" dimension and/or "substantially" oriented in a particular direction and/or configuration (e.g., "substantially parallel" or "substantially perpendicular") encompasses dimension differences between the two features and/or slight orientation variances of the two features from the exact specified orientation that may arise inherently, but not intentionally, from manufacturing tolerances associated with fabricating the two features. Still further, the present disclosure may repeat reference numerals and/or letters in the various examples. This repetition is for the purpose of simplicity and clarity and does not in itself dictate a relationship between the various embodiments and/or configurations described herein.

Integrated circuits (ICs), which are incorporated into many electronic devices, are typically built in a stacked-up fashion. For example, an IC may have transistors and/or other front-end-of-line (FEOL) devices at a frontside of a device substrate and form a lowest, bottom level of the IC. The IC may further have a routing structure (e.g., including a middle-of-line (MOL) interconnect structure and a back-end-of-line (BEOL) structure) over and above the transistors and the frontside of the device substrate. The routing (wiring) structure may be connected to devices, such as the transistors, and facilitate operation and/or electrical communication of and/or with the devices. For example, the routing structure may route and/or distribute signals (e.g., clock signals, voltage signals, ground signals, other signals, or combinations thereof) to and/or from the devices, device components, devices within the routing structure (e.g., memory devices), routing structure components, external devices and/or components, or combinations thereof. The routing structure may include metallization layers/levels, each of which may include electrically conductive lines and/or electrically conductive vias disposed in a dielectric structure. Electrically conductive vias may connect electrically conductive lines in different metallization layers of the routing structure.

Power rails (e.g., wiring that supplies power (e.g., voltage) to the devices and/or IC) and ground planes (e.g., wiring that connects the devices and/or IC to ground), which may form a portion of the routing structure, are also often formed above the transistors and the frontside of the device substrate. As dimensions of ICs shrink (including spacings of components thereof) with scaled IC technology nodes, so do the power rails and their dimensions. This may lead to increased voltage drop across the power rails, as well as increased power consumption of ICs. As the IC industry progresses into sub-10 nanometer (nm) technology process nodes in pursuit of higher device density, higher performance, and lower costs, a routing structure and/or power rails may be formed over a backside of the device substrate, which may provide the IC with reduced resistance and/or reduced coupling capacitance, thereby boosting the IC's performance and/or reducing the IC's power consumption. Backside routing structures and/or backside power rails may increase a number of routing/metal tracks available in the IC for connection to the devices (e.g., to source/drains thereof) and facilitate increased device density (e.g., transistors may be closely packed) for greater device integration than ICs without backside interconnects. Backside power rails may also have greater dimensions than lower metallization layers of the frontside routing structure, which beneficially reduces power rail resistance.

Advanced IC packaging technologies have also been explored to further reduce density and/or improve performance of ICs. For example, IC packaging has evolved, such that multiple ICs may be vertically stacked in three-dimensional ("3D") packages or 2.5D packages (e.g., packages that implement an interposer). With the introduction of backside power rails, IC packages may include chips stacked back-to-front. For example, an IC package may include a system on integrated circuit (SoIC) that includes a first chip and a second chip, a first redistribution layer (RDL) structure over a frontside of the first chip, and a second RDL structure over a backside of the second chip. The first RDL structure may be bonded/attached to the second RDL structure. The first RDL structure and the second RDL structure may each include a plurality of metallization layers (e.g., copper-based metallization layers) that facilitate electrical routing (and/or heat dissipation) and thus electrical communication between the first chip and the second chip. In such embodiments, the IC package indirectly bonds/attaches the first chip and the second chip via the first RDL structure and the second RDL structure. Through via may enable additional electrical and/or physical connections in the SoIC, such as electrical connection to and/or communication with external circuitry. For example, a TSV may be formed that extends vertically through the second chip to a third RDL structure of the IC package. The TSV may be electrically and/or physically connected to the first chip and/or the second chip.

As IC technology nodes scale, bonding pitches between RDL structures, such as the first RDL structure and the second RDL structure, are too large and constrain further scaling. The present disclosure proposes interconnect structures for IC packages that facilitate front-to-front stacking of chips and that reduce bonding pitches of bonding structures/bonding layers between bonded/attached chips. For example, frontside routing structures of a first chip and a second chip are directly bonded/attached to provide a front-to-front (face-to-face) chip stack, which may be an SoIC, and the IC package includes a TSV that extends partially through the frontside routing structure of the first chip, through a device layer of the first chip, through a backside routing structure of the second chip (which may include a backside power rail and/or be a backside power delivery network), and through a carrier substrate. The TSV may be electrically and physically connected to an RDL structure formed over the carrier substrate. Frontside routing structures of the first chip and the second chip are configured with smaller bonding pitches than RDL structures, enabling IC package scaling. Further, the smaller bonding pitches enable faster transmission of electrical signals between chips, such as the first chip and the second chip, improving chip and/or IC package performance. Different embodiments may have different advantages, and no particular advantage is required of any embodiment.

Figure 2:
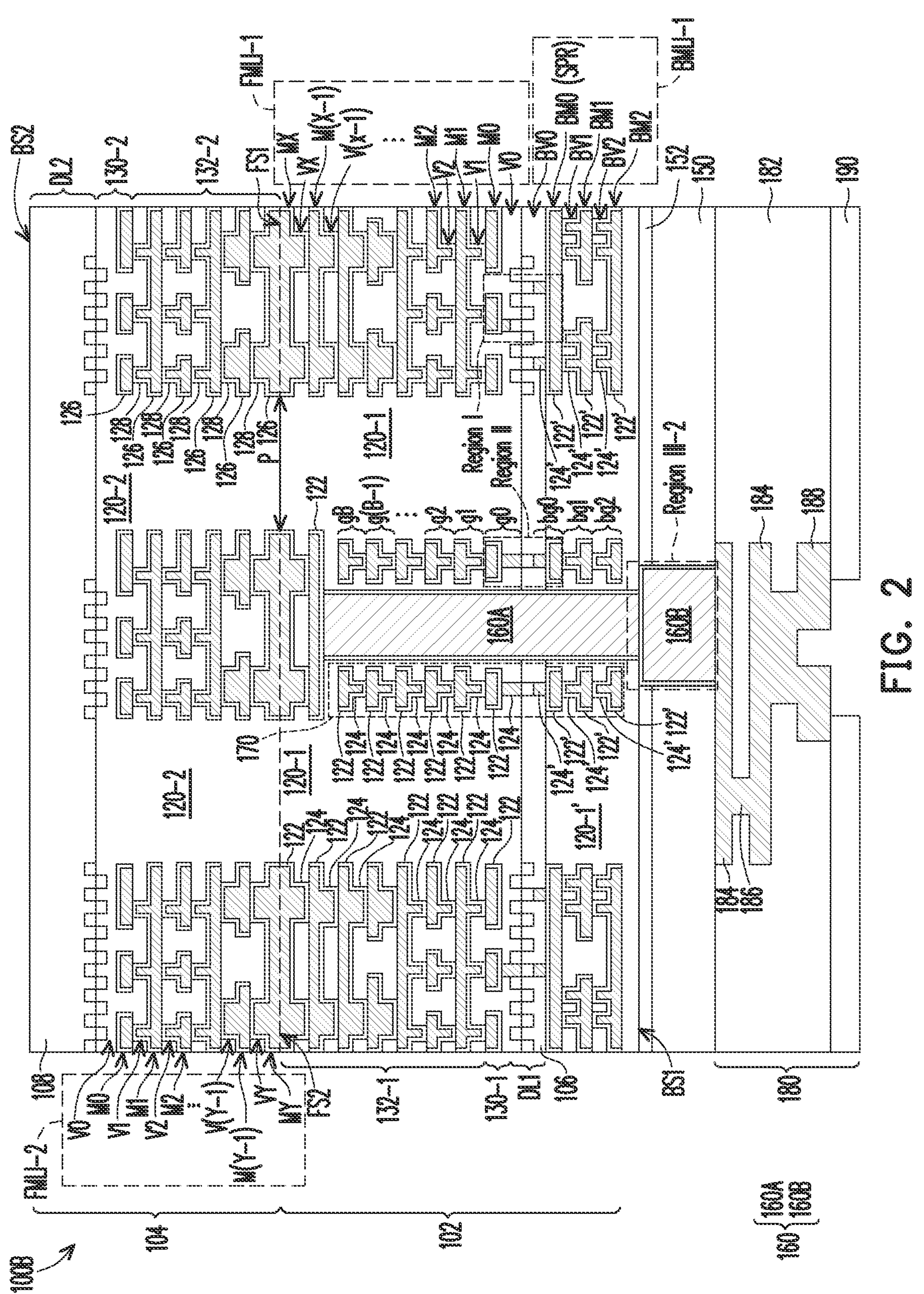
FIG. 2 is a cross-sectional view of the stacked chip structure, in portion or entirety, having another interconnect structure according to various aspects of the present disclosure.

FIG. 1 is a cross-sectional view of a stacked chip structure 100A, in portion or entirety, having an improved interconnect structure, according to various aspects of the present disclosure. FIG. 2 is a cross-sectional view of a stacked chip structure 100B, in portion or entirety, having another improved interconnect structure, according to various aspects of the present disclosure. Stacked chip structure 100B is similar in many respects to stacked chip structure 100A. Accordingly, similar features in FIG. 2 and FIG. 1 are identified by the same reference numbers for clarity and simplicity. FIG. 3A, FIG. 3B, FIG. 3C, FIG. 3D, and FIG. 3E are enlarged, cross-sectional views of portions of stacked chip structure 100A and/or stacked chip structure 100B, according to various aspects of the present disclosure. FIG. 4A, FIG. 4B, and FIG. 4C are top views of guard rings that may be formed around a through via, in portion or entirety, and that may be implemented in stacked chip structure 100A and/or stacked chip structure 100B, according to various aspects of the present disclosure. FIG. 1, FIG. 2, FIGS. 3A-3E, and FIGS. 4A-4C are discussed concurrently herein for ease of description and understanding. FIG. 1, FIG. 2, FIGS. 3A-3E, and FIGS. 4A-4C have been simplified for the sake of clarity to better understand the inventive concepts of the present disclosure. Additional features may be added in stacked chip structure 100A and/or stacked chip structure 100B, and some of the features described below can be replaced, modified, or eliminated in other embodiments of stacked chip structure 100 and/or stacked chip structure 100B.

Referring to FIG. 1, stacked chip structure 100A includes a chip 102 attached (bonded) to a chip 104 to form an IC (and/or semiconductor) package or portion thereof. Chip 102 and chip 104 each include at least one functional IC, such as an IC configured to perform a logic function, a memory function, a digital function, an analog function, a mixed signal function, a radio frequency (RF) function, an input/output (I/O) function, a communications function, a power management function, other function, or combinations thereof. In some embodiments, chip 102 and chip 104 provide the same function (e.g., both may be central processing units (CPUs)). In some embodiments, chip 102 and chip 104 provide different functions (e.g., one may be a CPU, while the other one may be a graphics processing unit (GPU) or a static random-access memory (SRAM)). In some embodiments, chip 102 and/or chip 104 is a system-on-chip (SoC), which generally refers to a single chip and/or monolithic die having multiple functions. In some embodiments, the SoC is a single chip having an entire system, such as a computer system, fabricated thereon. In the depicted embodiment, the IC package is a system on integrated chip (SoIC) package. The SoIC may have a multichip, hybrid node design, and chip 102 and chip 104 may have different functions (e.g., CPU, GPU, RF, SRAM, etc.) and be fabricated according to different process nodes (e.g., 3 nm (N3), N5, N65, 0.13-micron (μm) (C013), etc.), where the functions and the process nodes may be selected based on design specifications, such as power, performance, area, and cost (PPAC) specifications.

Chip 102 and chip 104 may each include a device layer, such as a device layer DL1 and a device layer DL2, respectively. Device layer DL1 includes a substrate 106 having circuitry fabricated on and/or over a frontside thereof by front end-of-line (FEOL) processing, and device layer DL2 includes a substrate 108 having circuitry fabricated on and/or over a frontside thereof by FEOL processing. For example, device layer DL1 and/or device layer DL2 include various device components/features, such as a semiconductor substrate, doped wells (e.g., n-wells and/or p-wells), isolation features (e.g., shallow trench isolation (STI) structures and/or other suitable isolation structures), gates (e.g., a gate stack having a gate electrode and a gate dielectric), gate spacers along sidewalls of the gates, source/drains (e.g., epitaxial source/drains), other suitable device components and/or device features, or combinations thereof. In some embodiments, device layer DL1 and/or device layer DL2 includes planar transistors, where a channel of a planar transistor is formed in a semiconductor substrate (e.g., substrate 106 and/or substrate 108) between respective source/drains and a respective gate is disposed on the channel (e.g., on a portion of the semiconductor substrate in which the channel is formed). In some embodiments, device layer DL1 and/or device layer DL2 includes non-planar transistors having channels formed in respective semiconductors fin that extend from a semiconductor substrate and between respective source/drains on/in the semiconductor fins, where a respective gate is disposed on and wraps a channel of a respective semiconductor fin (i.e., the non-planar transistors are fin-like field effect transistors (FinFETs)). In some embodiments, device layer DL1 and/or device layer DL2 includes non-planar transistors having channels formed in semiconductor layers suspended over a semiconductor substrate and extending between respective source/drains, where a respective gate is disposed on and at least partially surrounds respective channels (i.e., the non-planar transistors are gate-all-around (GAA) transistors and/or fork-sheet transistors). The transistors of device layer DL1 and/or device layer DL2 may be configured as planar transistors and/or non-planar transistors depending on design requirements. In some embodiments, device layer DL1 and/or device layer DL2 include stacked transistors, such as complementary field effect transistors (CFETs) and/or other stacked transistors.

Device layer DL1 and/or device layer DL2 may include various passive microelectronic devices and/or active microelectronic devices, such as resistors, capacitors, inductors, diodes, p-type FETs (PFETs), n-type FETs (NFETs), metal-oxide semiconductor (MOS) FETs (MOSFETs), complementary MOS (CMOS) transistors, bipolar junction transistors (BJTs), laterally diffused MOS (LDMOS) transistors, high voltage transistors, high frequency transistors, other suitable devices and/or components, or combinations thereof. The various microelectronic devices may be configured to provide functionally distinct regions of an IC, such as a logic region (i.e., a core region), a memory region, an analog region, a peripheral region (e.g., an I/O region), a dummy region, other suitable region, or combinations thereof. The logic region may be configured with standard cells, each of which may provide a logic device and/or a logic function, such as an inverter, an AND gate, a NAND gate, an OR gate, a NOR gate, a NOT gate, an XOR gate, an XNOR gate, other suitable logic device, or combinations thereof. The memory region may be configured with memory cells, each of which may provide a storage device and/or storage function, such as flash memory, non-volatile random-access memory (NVRAM), SRAM, dynamic random-access memory (DRAM), other volatile memory, other non-volatile memory, other suitable memory, or combinations thereof. In some embodiments, memory cells and/or logic cells include transistors and interconnect structures that combine to provide storage devices/functions and logic devices/functions, respectively.

Figure 3A:
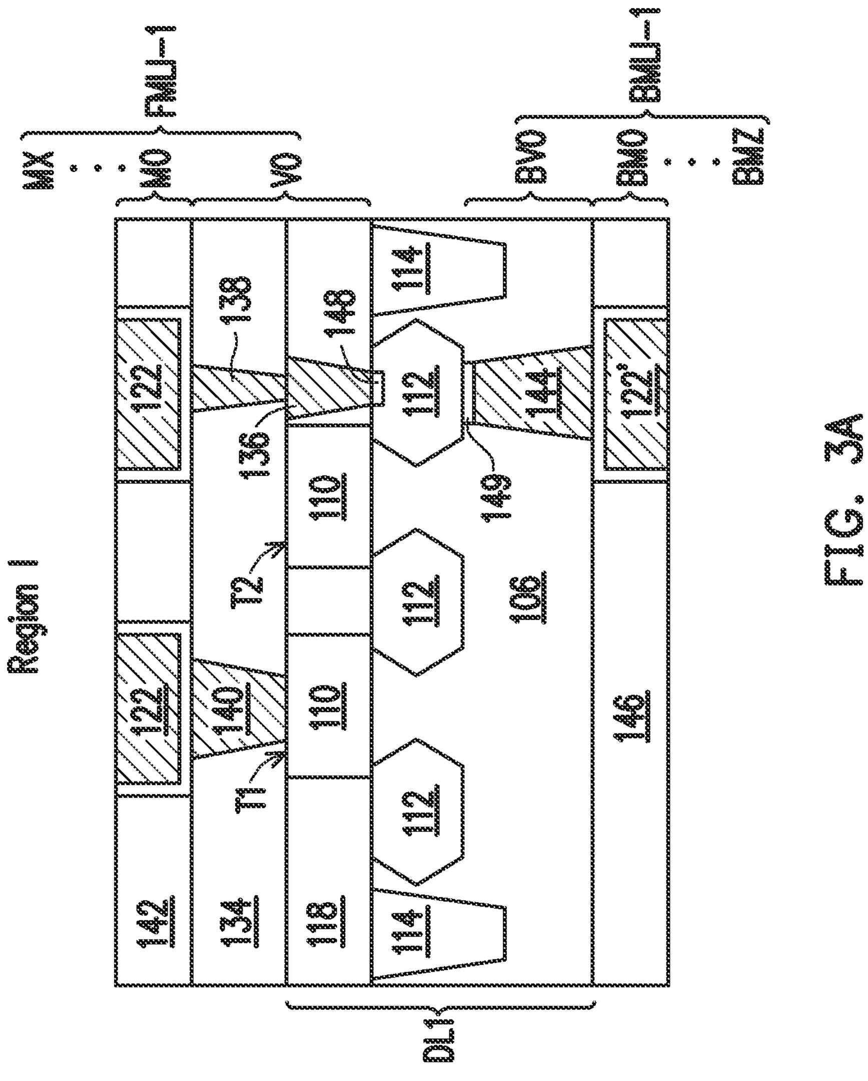
FIG. 3A, FIG. 3B, FIG. 3C, FIG. 3D, and FIG. 3E are enlarged, cross-sectional views of respective portions of the stacked chip structure of FIG. 1 and/or the stacked chip structure of FIG. 2, according to various aspects of the present disclosure.
Figures 4A, 4B, 4C:
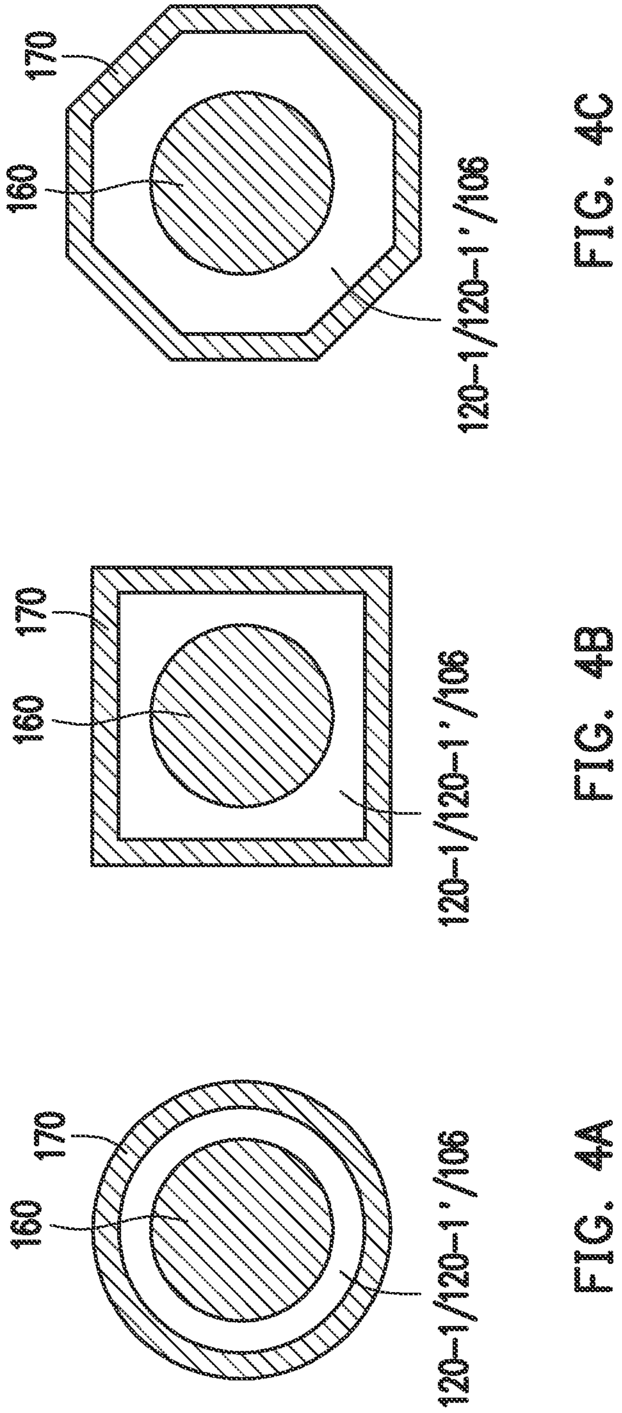
FIG. 4A, FIG. 4B, and FIG. 4C are top views of different configurations of guard rings that may be formed around a through via, in portion or entirety, and that may be implemented in the stacked chip structure of FIG. 1 and/or the stacked chip structure of FIG. 2, according to various aspects of the present disclosure.

Referring to FIG. 3A, an enlarged view of a Region I of stacked chip structure 100A of FIG. 1 and/or stacked chip structure 100B of FIG. 2 is provided that depicts a portion of device features and/or device components of a device layer of a chip, such as device layer DL1 of chip 102. In FIG. 3A, device layer DL1 includes various transistors, such as a transistor T1 and a transistor T2, formed over/on substrate 106. Transistor T1 and transistor T2 each include a respective gate structure 110 disposed between respective source/drains 112 (e.g., epitaxial source/drains), which are disposed in substrate 106, and transistor T1 and transistor T2 each have a respective channel that extends between respective source/drains 112 in substrate 106. Gate structures 110 may include a gate stack (e.g., a gate electrode disposed over a gate dielectric) and gate spacers disposed along sidewalls of the gate stack, and substrate 106 may be a semiconductor substrate (e.g., a silicon substrate). Device layer DL1 may further include isolation structures 114, such as STI structures, that separate and/or electrically isolate transistor T1 and/or transistor T2 from other transistors or devices of device layer DL1. Device layer DL1 may further include an insulator layer, such as a dielectric layer 118, disposed over substrate 106, and gate structures 110 of transistor T1 and transistor T2 may be disposed in dielectric layer 118. In some embodiments, dielectric layer 118 has a multilayer structure and may include, for example, an interlayer dielectric (ILD) layer and/or a contact etch stop layer (CESL). Device layer DL2 may be configured similar to device layer DL1 (e.g., having transistors).

Referring back to FIG. 1, chip 102 and chip 104 may each include a frontside multilayer interconnect (FMLI) structure, such as an FMLI-1 structure over a frontside of substrate 106 and an FMLI-2 structure over substrate 108, respectively. Chip 102 and/or chip 104 may each further include a backside multilayer interconnect (BMLI) structure, such as a BMLI-1 structure over a backside of substrate 106. Each of FMLI-1 structure, FMLI-2 structure, and BMLI-1 structure include a combination of dielectric layers (depicted as an insulation layer 120-1, an insulation layer 120-2, and an insulation layer 120-1', respectively) and electrically conductive layers (e.g., patterned metal layers, each of which may be a group of metal lines, metal vias, metal contacts, or combinations thereof arranged in a desired pattern) that combine to form interconnect (routing) structures. The interconnect structures may include vertically oriented conductive features, such as metal contacts and/or metal vias, that connect horizontally oriented conductive features, such as metal lines, in different layers/levels (or different planes) of a respective MLI structure. In some embodiments, the interconnect structures route electrical signals between devices and/or components of device layer DL-1, device layer DL-2, FMLI-1 structure, FMLI-2 structure, BMLI-1 structure, external devices and/or components, or combinations thereof. In some embodiments, the interconnect structures distribute electrical signals (e.g., clock signals, voltage signals, ground signals, etc.) to the devices and/or the device components of device layer DL-1, device layer DL-2, FMLI-1 structure, FMLI-2 structure, BMLI-1 structure, external devices and/or components, or combinations thereof.

FMLI-1 structure includes a device-level contact layer and/or via layer (collectively referred to as a via zero layer (V0 level)), a metal zero layer (M0 level), a via one layer (V1 level), a metal one layer (M1 level), a via two layer (V2 level), a metal two layer (M2 level), and so on to a via (X-1) layer (V(X-1) level), a metal (X-1) layer (M(X-1) level), a via X layer (VX level), and a metal X layer (MX level), where X is an integer (e.g., from 2 to 10). Each level of FMLI-1 structure may include conductive features, such as metal lines 122 or metal vias 124, disposed in a portion of insulation layer 120-1. Metal lines 122 of M0 level, M1 level, M2 level, . . . M(X-1) level, and MX level may be referred to as M0 lines, M1 lines, M2 lines, . . . M(X-1) lines, and MX lines, respectively. Metal vias 124 of V0 level, V1 level, V2 level, . . . V(X-1) level, and VX level may be referred to as V0 vias, V1 vias, V2 vias, . . . V(X-1) vias, and VX vias, respectively. Each metal via 124 may physically and/or electrically connect an underlying metal line 122 (e.g., a respective M1 line) and an overlying metal line 122 (e.g., a respective M2 line), an underlying device-level contact (e.g., a source/drain contact) and an overlying metal line 122 (e.g., a respective M0 line), or an underlying device feature (e.g., a gate and/or a source/drain) and an overlying metal line 122 (e.g., a respective M0 line).

FMLI-2 structure may be similar to FMLI-1 structure. For example, FMLI-2 structure includes a respective V0 level, a respective M0 level, a respective V1 level, a respective M1 level, a respective V2 level, a respective M2 level, and so on to a via (Y-1) layer (V(Y-1) level), a metal (Y-1) layer (M(Y-1) level), a via Y layer (VY level), and a metal Y layer (MY level), where Y is an integer (e.g., from 2 to 10). In the depicted embodiment, Y is less than X. In some embodiments, Y is the same as X. In some embodiments, Y is greater than X. Each level of FMLI-2 structure may include conductive features, such as metal lines 126 or metal vias 128, disposed in a portion of insulation layer 120-2. Metal lines 126 of M0 level, M1 level, M2 level, . . . M(Y-1) level, and MY level may be referred to as M0 lines, M1 lines, M2 lines, . . . M(Y-1) lines, and MY lines, respectively. Metal vias 128 of V0 level, V1 level, V2 level, . . . V(Y-1) level, and VY level may be referred to as V0 vias, V1 vias, V2 vias, . . . V(Y-1) vias, and VY vias, respectively. Each metal via 128 may physically and/or electrically connect an underlying metal line 126 (e.g., a respective M1 line) and an overlying metal line 126 (e.g., a respective M2 line), an underlying device-level contact (e.g., a source/drain contact) and an overlying metal line 126 (e.g., a respective M0 line), or an underlying device feature (e.g., a gate and/or a source/drain) and an overlying metal line 126 (e.g., a respective M0 line).

BMLI-1 structure may be similar to FMLI-1 structure. For example, BMLI-1 structure includes a device-level contact layer and/or a device-level via layer (collectively referred to as a via zero layer (BV0 level)), a metal zero layer (BM0 level), a via one layer (BV1 level), a metal one layer (BM1 level), a via two layer (BV2 level), and a metal two layer (BM2 level). Each level of BMLI-1 structure includes conductive features, such as metal lines 122' or metal vias 124', disposed in a portion of insulation layer 120-1' and/or a portion of substrate 106. Metal lines 122' of BM0 level, BM1 level, and BM2 level may be referred to as BM0 lines, BM1 lines, and BM2 lines, respectively. Metal vias 124' of BV0 level, BV1 level, and BV2 level may be referred to as BV0 vias, BV1 vias, and BV2 vias. Each metal via 124' may physically and/or electrically connect an underlying metal line 122' (e.g., a respective BM1 line) and an overlying metal line 122' (e.g., a respective BM2 line), an underlying device-level contact (e.g., a source/drain contact) and an overlying metal line 122' (e.g., a respective BM0 line), or an underlying device feature (e.g., a gate and/or a source/drain) and an overlying metal line 122 (e.g., a respective BM0 line). In some embodiments, one or more of metal lines 122' of BM0 level are power rails electrically connected to transistors of device layer DL1 by metal vias 124' of BV0 level. For example, right metal line 122' of BM0 level may be electrically connected to a source/drain of transistor T2, such as source/drain 112, by a respective metal via 124' (which may be a backside source/drain contact, such as a respective backside source/drain contact 144) of BV0 level. BM0 level may thus be referred to as a power delivery layer/level and/or a backside super power rail (SPR) of chip 102. BMLI-1 structure may have more or less layers/levels, for example, up to a BMZ level, where Z is an integer (e.g., 2 to 10).

Device level (e.g., a bottommost level) of FMLI-1 structure (e.g. V0 level), FMLI-2 structure (e.g., V0 level), and BMLI-1 structure (e.g., BV0 level) may be fabricated by middle-of-line (MOL) processing, and additional levels of FMLI-1 structure (e.g. M0 level and up), FMLI-2 structure (e.g., M0 level and up), and BMLI-1 structure (e.g., BM0 level and up) may be fabricated by back-end-of-line (BEOL) processing. V0 levels of chip 102 and chip 104 may thus be referred to as an MOL structure 130-1 and an MOL structure 130-2, respectively, and M0 level and up of chip 102 and chip 104 may be referred to as a BEOL structure 132-1 and a BEOL structure 132-2, respectively. Referring again to FIG. 3A, Region I further depicts a portion of V0 level, M0 level, BV0 level, and BM0 level of chip 102. For example, on a frontside of device layer DL-1, V0 level includes dielectric layer 118, a dielectric layer 134 over dielectric layer 118, source/drain contacts (MDs) in dielectric layer 118 (e.g., a source drain contact 136), source/drain vias (VDs) (e.g., a source/drain via 138) in dielectric layer 134, gate contacts (VGs) (e.g., a gate contact 140) in dielectric layer 134, and M0 level includes a dielectric layer 142 having metal lines 122 disposed therein. In some embodiments, V0 level may include an MD level formed by source/drain contacts and a VD/VG level formed by source/drain vias and gate contacts. Source/drain contact 136 electrically and/or physically connects a frontside of a respective source/drain 112 to source/drain via 138, source/drain via 138 electrically and/or physically connects source/drain contact 136 to a respective metal line 122 of M0 level of FMLI-1 structure, and gate contact 140 electrically and/or physically connects a respective gate structure 110 (e.g., a gate electrode thereof) to a respective metal line 122 of M0 level of FMLI-1 structure. Further, on a backside of device layer DL-1, BV0 level includes backside source/drain contacts, such as a backside source/drain contact 144, in substrate 106, and BM0 level includes a dielectric layer 146 having metal lines 122' disposed therein. The backside source/drain contacts may be disposed in electrically insulated portions of substrate 106, such as in one or more backside dielectric layer(s) and/or isolation structures thereof. Backside source/drain contact 144 electrically and/or physically connects a backside of a respective source/ drain 112 to a respective metal line 122' of BM0 level of BMLI-1 structure. In the depicted embodiment, one of source/drains 112 is disposed between and connected to both a respective frontside source/drain contact 136 and a respective backside source/drain contact 144. In some embodiments, a frontside silicide layer 148 may be between source/drain 112 and frontside source/drain contact 136, and a backside silicide layer 149 may be between source/drain 112 and backside source/drain contact 144. Frontside silicide layer 148 and/or backside silicide layer 149 may reduce source/drain contact resistance. Dielectric layer 118, dielectric layer 134, and dielectric layer 142 may form a portion of insulation layer 120-1 of FMLI-1 structure, and dielectric layer 146 may form a portion of insulation layer 120-1' of BMLI-1 structure.

Referring back to FIG. 1, chip 102 and chip 104 are stacked and attached (bonded) front-to-front and/or face-to-face. For example, chip 102 has a frontside FS1 formed by FMLI-1 structure and a backside BS1 formed by BMLI-1 structure, chip 104 has a frontside FS2 formed by FMLI-2 structure and a backside BS2 formed by device layer DL2 (e.g., by a backside of substrate 108), and FMLI-1 structure is attached (bonded) to FLMI-2 structure. In the depicted embodiment, MX level of FLMI-1 structure (e.g., topmost metal line layer thereof) is directly bonded to and physically contacts MY level of FMLI-2 structure (e.g., topmost metal line layer thereof). For example, metal lines 122 of MX level are directly bonded and physically contact metal lines 126 of MY level, such that FLMI-1 structure may be electrically connected to FMLI-2 structure. Metal lines 122 of MX level and/or metal lines 126 of MY level may thus be referred to as bonding pads and/or bonding layers of chip 102 and chip 104, respectively. Further, insulation layer 120-1 of FMLI-1 structure is directly bonded and physically contacts insulation layer 120-2 of FMLI-2 structure. Face-to-face bonding of chip 102 and chip 104 may be achieved by dielectric-to-dielectric bonding (e.g., oxide-to-oxide bonding), metal-to-metal bonding (e.g., copper-to-copper bonding), metal-to-dielectric bonding (e.g., copper-to-oxide bonding), other type of bonding, or combinations thereof.

To achieve face-to-face intermetal bonding of chip 102 and chip 104 (i.e., bonding between frontside MLIs), a pitch of MX level is the same as a pitch of MY level. A pitch of a patterned metal layer generally refers to a sum of a width of metal lines (e.g., metal lines 122 or metal lines 126) of the patterned metal layer and a spacing between directly adjacent metal lines of the patterned metal layer (i.e., a lateral distance between edges of directly adjacent metal lines 122 or metal lines 126 of the patterned metal layer). In some embodiments, a pitch of the patterned metal layer is a lateral distance between centers of directly adjacent metal lines 122 or metal lines 126 of the patterned metal layer. In the depicted embodiment, MX level and MY level have a pitch P, which is referred to a bonding pitch since MX level and MY level are bonding layers for face-to-face intermetal bonding of chip 102 and chip 104 (i.e., for direct FMLI bonding thereof). Pitch P is less than a bonding pitch of bonding layers of frontside redistribution layer (RDL) structures that are typically used to indirectly, face-to-face bond chip 102 and chip 104 (e.g., where a first RDL structure is formed over FMLI-1 structure of chip 102, a second RDL structure is formed over FMLI-2 structure of chip 104, the first RDL structure is bonded (attached) to the second RDL structure, and bonding layers of the first RDL structure and the second RDL structures have a bonding pitch that is much greater than pitch P). Smaller intermetal bonding pitch P improves chip-to-chip speed (e.g., by increasing signal transmission therebetween) and/or chip performance. In some embodiments, pitch P is less than about 0.5 Å to facilitate faster signal transmission between chip 102 and chip 104 than signal transmission speeds achieved when chip 102 and chip 104 are indirectly face-to-face bonded through respective frontside RDL structures having bonding pitches greater than pitch P. In some embodiments, pitch P is about 0.5 Å to 0.1 Å. In some embodiments, pitch P is about 0.09 Å to 0.05 Å. In some embodiments, pitch P is about 0.05 Å to 0.01 Å. Pitch P greater than 0.5 Å may not realize meaningful chip-to-chip speed improvements and/or chip performance compared to RDL bonding pitches when face-to-face bonding chips through frontside RDL structures.

In some embodiments, metal layers of FMLI-1 structure, FMLI-2 structure, BMLI-structure, or combinations thereof may have different pitches. Metal layers having a same pitch may be grouped together. For example, pitch of metal layers may increase as a distance from a device layer increases. In some embodiments, FMLI-1 structure and/or FMLI-2 structure may have a first set metal layers (e.g., bottom metal layers close to their respective device layer) having a pitch P1, a second set of metal layers (e.g., middle metal layers) having a pitch P2, and a third set of metal layers (e.g., top metal layers, such as MX level, M(X-1) level, MY level, and M(Y-1) level)) having pitch P. Pitch P1, pitch P2, and pitch P are different, and in some embodiments, pitch P1 is less than pitch P2, and pitch P2 is less than pitch P. In such embodiments, pitch of metal of FMLI-1 structure and/or FMLI-2 structure increases as distance increases between the FMLI structures and the frontside of a device substrate. Other pitch variations are contemplated by the present disclosure. For example, the FMLI structures and the BMLI structure may include any number of metal layer sets (groups) having different pitches depending on IC technology node and/or IC generation (e.g., 20 nm, 5 nm, etc.).

A carrier substrate (wafer) 150 may be attached (bonded) to backside BS1 of chip 102 by a bonding layer 152. In the depicted embodiment, BMLI-1 structure is bonded to carrier substrate 150 through bonding layer 152. In some embodiments, carrier substrate 150 includes bulk silicon (e.g., carrier substrate 150 may be a silicon substrate). In some embodiments, carrier substrate 150 includes another suitable material that provides sufficient rigidity and/or mechanical support for chip 102. In some embodiments, bonding layer 152 is an oxide layer. In some embodiments, bonding layer 152 is another suitable material that facilitates bonding of carrier substrate 150 with insulation layer 120-1' and/or metal lines 122'.

Chip 102 further includes a through substrate via (TSV) 160 (also referred to as a through via, a through silicon via, or a through semiconductor via) and guard ring 170. Guard ring 170 is spaced apart from and around TSV 160, and insulation layer 120-1, insulation layer 120-1', and substrate 106 (e.g., an insulative portion thereof) may fill the spacing between guard ring 170 and TSV 160. Referring to FIGS. 4A-4C, from a top view, guard ring 170 may be a circular ring (FIG. 4A), a square ring (FIG. 4B), an octagonal ring (FIG. 4C), a hexagonal ring, or other suitable shaped ring around TSV 160. In the depicted embodiments, guard ring 170 extends continuously around TSV 160. In some embodiments, guard ring 170 is discontinuous around TSV 160. For example, guard ring 170 may be formed by discrete segments that combine to form a ring around TSV 160. In some embodiments, guard ring 170 is electrically connected to a voltage. In some embodiments, guard ring 170 is electrically connected to an electrical ground. In some embodiments, guard ring 170 is configured to electrically insulate TSV 160 from device regions of chip 102. For example, in FIG. 1, TSV 160 may be disposed between device regions of chip 102 that include transistors of device layer DL-1, portions of FMLI-1 structure thereover and connected thereto, and portions of BMLI-1 structure thereover and connected thereto, guard ring 170 may be disposed between TSV 160 and these device regions, and guard ring 170 may electrically insulate TSV 160 from these device regions. In some embodiments, guard ring 170 absorbs and/or reduces thermal stress and/or mechanical stress from, within, and/or around TSV 160. In some embodiments, guard ring 170 provides structural support, integrity, reinforcement, or combinations thereof for TSV 160.

Guard ring 170 may be formed from a portion of FMLI-1 structure, a portion of BMLI-1 structure, and a portion of device layer DL-1. In the depicted embodiment, guard ring 170 has a frontside interconnect structure stack disposed in and extending through insulation layer 120-1, a backside interconnect structure stack disposed in and extending through insulation layer 120-1', and a device-level interconnect structure disposed in and extending through device layer DL-1. The frontside interconnect structure stack includes a guard ring zero layer (g0 level), a guard ring one layer (g1 level), and so on to a guard ring g(B-1) layer (g(B-1) level), and a guard ring B layer (gB level), where B is an integer (e.g., from 2 to 10). The backside interconnect structure stack includes a backside guard ring zero layer (bg0 level), a backside guard ring one layer (g1 level), and a backside guard ring two layer (bg2 level). Each interconnect structure of frontside interconnect structure stack may include a respective metal line 122 and a respective metal via 124, and each interconnect structure of backside interconnect structure stack may include a respective metal line 122' and a respective metal via 124'. In some embodiments, such as depicted, metal vias 124 of g0 level are disposed over substrate 106, while metal vias 124' of bg0 level are disposed in substrate 106. The frontside interconnect structure stack and/or the backside interconnect structure stack may have more or less interconnect structures, and the frontside interconnect structure stack and/or the backside interconnect structure stack may have a number of interconnect structures that is more than, less than, or the same as a number of levels of FMLI-1 structure and BMLI-1 structure, respectively.

Figure 3B:
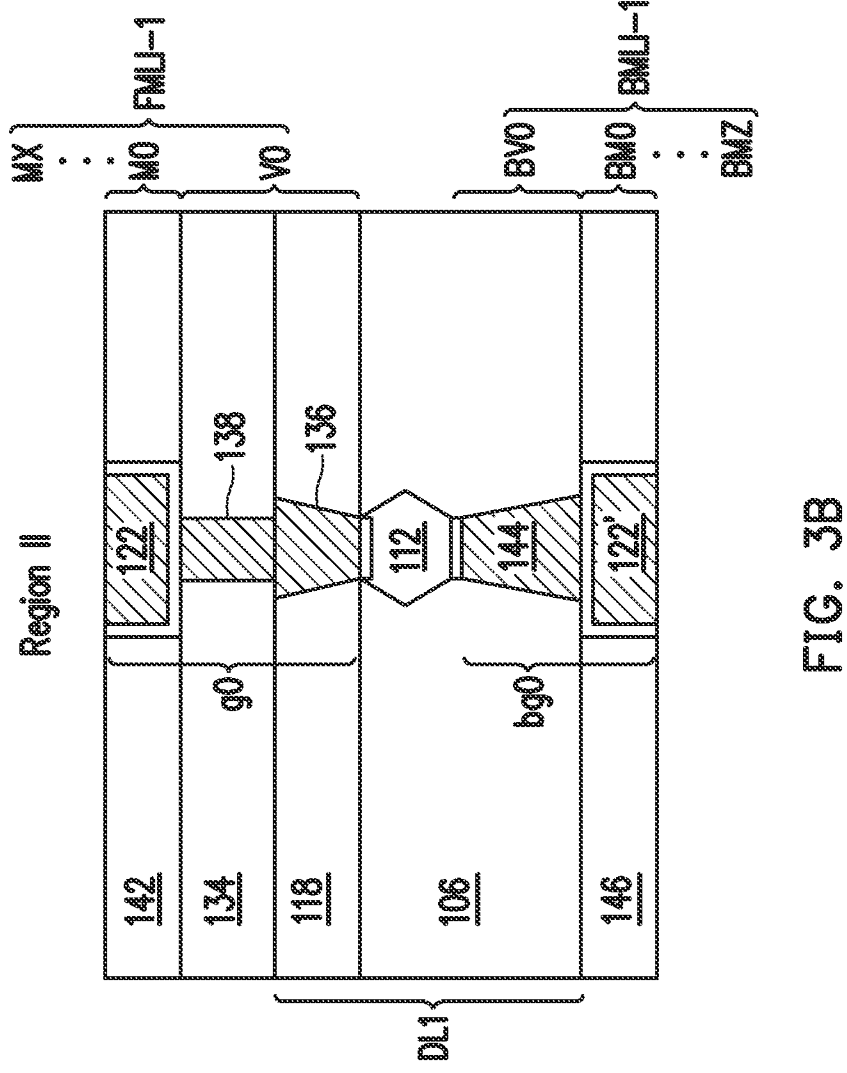

Referring to FIG. 3B, an enlarged view of a Region II of stacked chip structure 100A of FIG. 1 and/or stacked chip structure 100B of FIG. 2 is provided that depicts a device-level portion of a guard ring, such as a portion of device layer DL1 that may form guard ring 170. In FIG. 3B, the portion of device layer DL1 includes dielectric layer 118, dielectric layer 134, and dielectric layer 142 over the frontside of substrate 106, and dielectric layer 146 over the backside of substrate 106. The device-level portion of guard ring 170 may include a respective source/drain 112 in substrate 106, a frontside device-level interconnect structure at g0 level (which, in the depicted embodiment, includes a respective source/drain contact 136 in dielectric layer 118, a respective source/drain via 138 in dielectric layer 134, and a respective metal line in dielectric layer 142), and a backside device-level interconnect structure at bg0 level (which, in the depicted embodiment, includes a respective backside source/drain contact 144 in substrate 106 and a respective metal line 122' in dielectric layer 146). The respective backside source/drain contact 144 may be disposed in an insulation portion of substrate 106, such as a dielectric layer and/or an isolation structure therein, such that backside source/drain contact 144 is electrically isolated from other electrically conductive features in substrate 106. Guard ring 170 may thus have a respective source/drain 112 between and connected to a respective frontside source/drain contact 136 and a respective backside source/drain contact 144, and the frontside interconnect structure stack (e.g., g0 level to gB level) may be electrically connected to the backside interconnect structure stack (e.g., bg0 level to bg2 level) through the respective source/drain 112. In such embodiments, the device-level portion of guard ring 170 may be referred to as a frontside source/drain via to frontside source/drain contact to source/drain to backside source/drain contact structure (e.g., VD/MD/SD/VB structure). Further, in such embodiments, the device-level portion of guard ring 170 is formed in an active region.

Figure 3C:
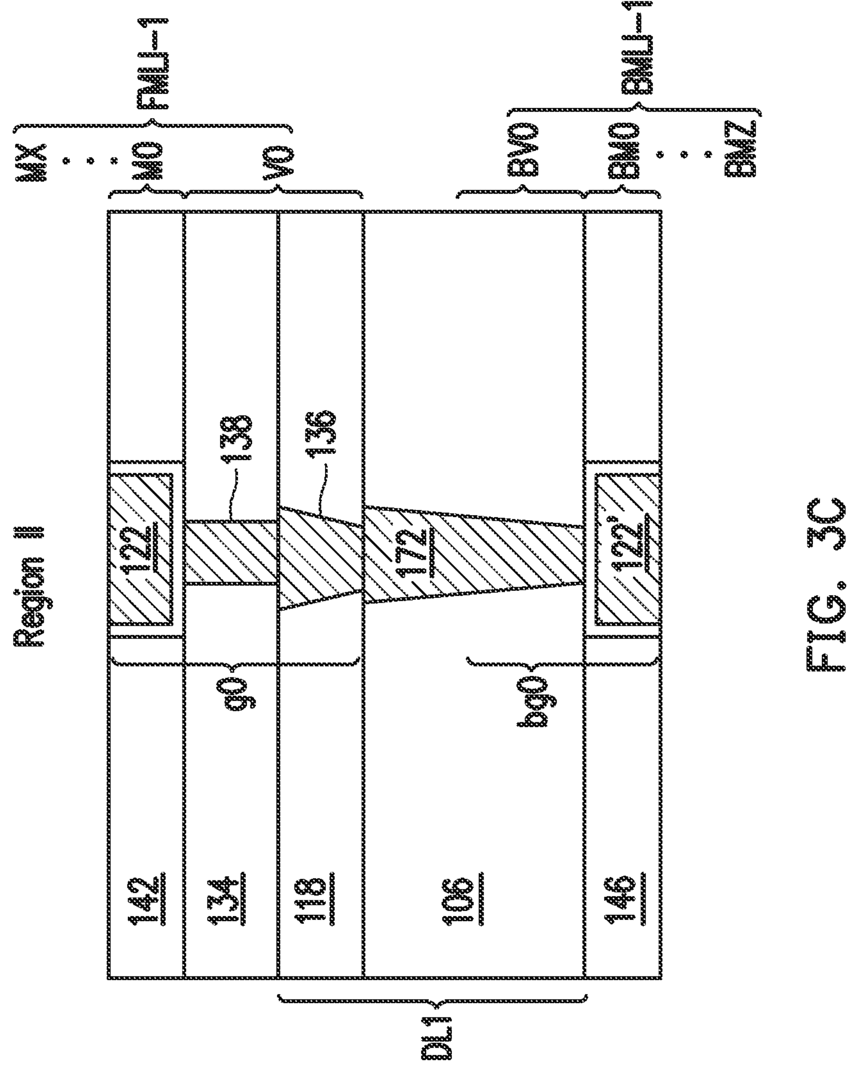

Referring to FIG. 3C, an enlarged view of a Region II of stacked chip structure 100A of FIG. 1 and/or stacked chip structure 100B of FIG. 2 is provided that depicts another configuration of the device-level portion of the guard ring, such as the portion of device layer DL1 that may form guard ring 170. In FIG. 3C, the portion of device layer DL1 includes dielectric layer 118, dielectric layer 134, and dielectric layer 142 over the frontside of substrate 106, and dielectric layer 146 over the backside of substrate 106. Instead the device-level portion of the guard ring having a source/drain as configured in FIG. 3B, in FIG. 3C, the device-level portion of guard ring 170 may include a via 172 in substrate 106, a frontside device-level interconnect structure at g0 level (which, in the depicted embodiment, includes a respective source/drain contact 136 in dielectric layer 118, a respective source/drain via 138 in dielectric layer 134, and a respective metal line in dielectric layer 142), and a backside device-level interconnect structure at bg0 level (which, in the depicted embodiment, includes a portion of via 172 in substrate 106 and a respective metal line 122' in dielectric layer 146). Via 172 may be disposed in an insulation portion of substrate 106, such as a dielectric layer and/or an isolation structure therein, such that via 172 is electrically isolated from other electrically conductive features in substrate 106. In some embodiments, via 172 may extend through a semiconductor substrate and an isolation structure, such as an STI. Guard ring 170 may thus have via 172 between and connected to a respective frontside source/drain contact 136 and a respective backside metal line 122', and the frontside interconnect structure stack (e.g., g0 level to gB level) may be electrically connected to the backside interconnect structure stack (e.g., bg0 level to bg2 level) through via 172. In such embodiments, the device-level portion of guard ring 170 may be referred to as a frontside source/drain via to frontside source/drain contact to power via structure (e.g., VD/MD/PV structure). Further, in such embodiments, the device-level portion of guard ring 170 is formed in an isolation region, such as an STI region.

Referring back to FIG. 1, TSV 160 is physically and electrically connected to a respective metal line 122 of M(X-1) level of FMLI-1 structure, which is physically and electrically connected to a respective metal line 122 of MX level of FMLI-1 structure, which is physically (e.g., bonded/attached) and electrically connected to a respective metal line 126 of MY level of FMLI-2 structure. TSV 160 is thus electrically connected to FMLI-2 structure of chip 104, and TSV 160 may facilitate electrical connection of and/or electrical communication with chip 104 to external circuitry. TSV 160 vertically extends from the respective metal line 122 of M(X-1) level, partially through insulation layer 120-1 of FMLI-1 structure, through device layer DL1 (e.g., substrate 206 thereof), through insulation layer 120-1' of BMLI-1 structure, through bonding layer 152, and through carrier substrate 150. TSV 160 may extend vertically beyond a top of guard ring 170. In the depicted embodiment, the respective metal line 122 of M(X-1) level extends laterally over the top of guard ring 170, guard ring 170 does not include metal vias 124 in V(X-1) level, and guard ring 170 (e.g., topmost metal lines 122 thereof) are not electrically and/or physically connected to the respective metal line 122 of M(X-1) level. Guard ring 170 is thus not electrically connected to TSV 160 (e.g., through the respective metal line 122 of M(X-1) level). In some embodiments, guard ring 170 may include metal vias 124 in V(X-1) level, and guard ring 170 (e.g., topmost metal lines 122 thereof) may be electrically and/or physically connected to the respective metal line 122 of M(X-1) level, such that guard ring 170 may be electrically connected to TSV 160.

Figure 3E:
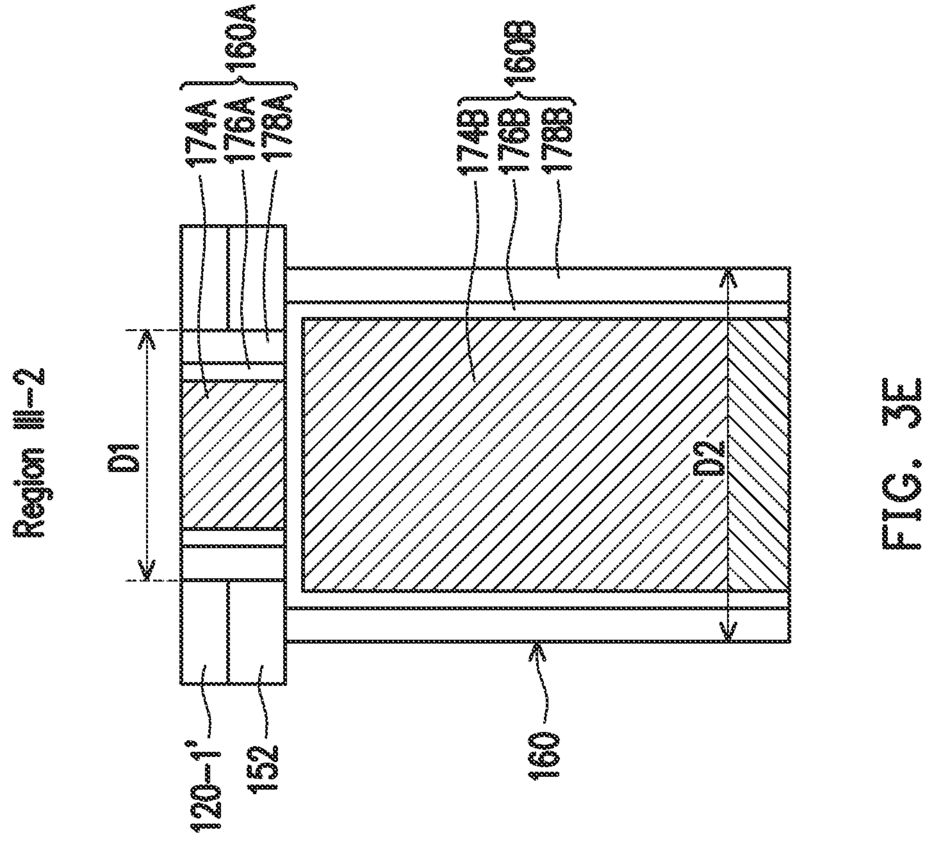
Figure 3D:
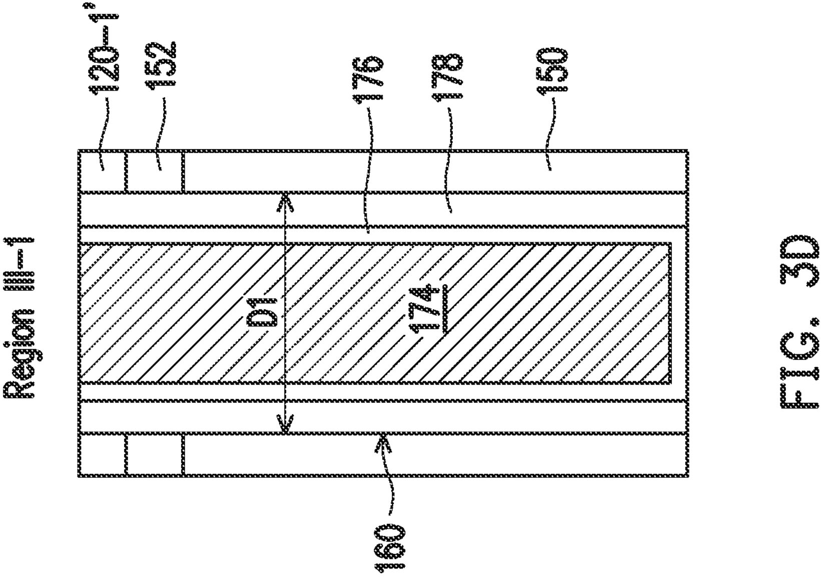

Referring to FIG. 3D, an enlarged view of a Region III-1 of stacked chip structure 100A of FIG. 1 is provided that depicts a portion of TSV 160, according to some embodiments. In FIG. 1 and FIG. 3D, TSV 160 is a single, continuous structure that extends through insulation layer 120-1, substrate 206, insulation layer 120-1', bonding layer 152, and carrier substrate 150. In such embodiments, TSV 160 may be formed by a single TSV fabrication process. The single, continuous structure may include an electrically conductive core 174 (e.g., a metal core), a barrier layer 176, and a dielectric liner 178. Electrically conductive core 174 is wrapped by barrier layer 176, such that barrier layer 176 is disposed along a bottom and sidewalls of electrically conductive core 174. Barrier layer 176 is between dielectric liner 178 and electrically conductive core 174, and dielectric liner 178 is between barrier layer 176 and insulation layer 120-1, substrate 106, insulation layer 120-1', bonding layer 152, and carrier substrate 150. Thus, a top/frontside of TSV 160 is formed by electrically conductive core 174 and barrier layer 176, a bottom/backside of TSV 160 is formed by barrier layer 174 and dielectric liner 178, and sidewalls of TSV 160 are formed by dielectric liner 178.

Electrically conductive core 174 (which may also be referred to as a pillar, a metal pillar, a bulk metal layer, a metal fill layer, a conductive plug, a metal plug, etc.) includes an electrically conductive material, such as aluminum, copper, titanium, tantalum, tungsten, ruthenium, cobalt, iridium, palladium, platinum, nickel, tin, gold, silver, other suitable metals, alloys thereof, silicides thereof, or combinations thereof. For example, electrically conductive core 174 may include copper (i.e., TSV 160 includes a copper plug), tungsten (i.e., TSV 160 includes a tungsten plug), or polysilicon (i.e., TSV 160 includes a polysilicon plug). Barrier layer 176 may include titanium, titanium alloy (e.g., TiN and/or TiC), tantalum, tantalum alloy (e.g., TaN and/or TaC), aluminum, aluminum alloy (e.g., AlON and/or $Al_2O_3$), other suitable barrier material (e.g., a material that can prevent diffusion of metal constituents from electrically conductive core 174 into insulation layer 120-1, substrate 106, insulation layer 120-1', bonding layer 152, carrier substrate 150, or combinations thereof), or combinations thereof. Dielectric liner 178 includes a dielectric material, such as silicon oxide, silicon nitride, other suitable dielectric material, or combinations thereof. For example, dielectric liner 178 may be an oxide layer, a silicon nitride layer, or a silicon carbonitride layer. Electrically conductive core 174, barrier layer 176, dielectric liner 178, or combinations thereof may have a multilayer structure. For example, electrically conductive core 174 may include a seed layer and a metal plug, where the seed layer is between the metal plug and barrier layer 176. The seed layer may include copper tungsten, other suitable metals, alloys thereof, or combinations thereof.

In FIG. 1 and FIG. 3D, the single, continuous structure of TSV 160 has a substantially vertical sidewall profile, and TSV 160 has a diameter D1 (and/or a width) (e.g., along the x-direction and/or the y-direction) that is substantially the same along its thickness (and/or its length) (e.g., along the z-direction). In some embodiments, TSV 160 has a circular shape in a top view (FIGS. 4A-4C), and TSV 160 may be a cylindrical structure. TSV 160 may have different shapes in a top view, such as a square shape, a rhombus shape, a trapezoidal shape, a hexagonal shape, an octagonal shape, or other suitable shape. In some embodiments, diameter D1 (and/or the width) of TSV 160 varies along the thickness (and/or length) of TSV 160. For example, the single, continuous structure of TSV 160 may have a tapered sidewall profile (i.e., tapered sidewalls), and diameter D1 (and/or the width) of TSV 160 decreases or increases along the thickness (and/or length) of TSV 160. The present disclosure contemplates the single, continuous structure of TSV 160 having various sidewall profile configurations, such that TSV 160 may have various variations of diameter D1 along its thickness.

TSV 160 (e.g., a bottom thereof) is physically and electrically connected to a redistribution layer (RDL) structure 180, which is configured to electrically connect stacked chip structure 100A and/or stacked chip structure 100B (i.e., the SoIC) to external circuitry and/or external devices. RDL structure 180 may include an insulation layer 182 having RDL lines 184, RDL via(s) 186, and contact pad(s) 188 disposed therein, along with a protection layer 190. In the depicted embodiment, TSV 160 is physically and electrically connected to a top RDL line 184 of RDL structure 180, and TSV 160 is electrically connected to contact pad 188 by a combination of RDL lines 184 and RDL vias 186, such that TSV 160 may be electrically connected to external circuitry. In stacked chip structure 100A, barrier layer 176 of TSV 160 is disposed between electrically conductive plug 174 of TSV 160 and top RDL line 184, and electrically conductive plug 174 does not physically contact top RDL line 184. In stacked chip structure 100B, barrier layer 176B and electrically conductive plug 184B of TSV 160 physically contact top RDL line 184. In some embodiments, RDL structure 180 electrically connects chip 102 and/or chip 104 (e.g., components and/or devices thereof, such as transistors) to external circuitry. In some embodiments, RDL structure 180 redistributes a layout of connections between devices and/or components of chip 102 and/or chip 104 to facilitate signal transmission and/or power transmission. In some embodiments, RDL structure 180 redistributes bonding pads to different locations, such as from peripheral locations to being uniformly distributed over a surface of stacked chip structure 100A (and/or chip 102 thereof) and/or stacked chip structure 100B (and/or chip 102 thereof). In some embodiments, RDL structure 180 electrically couples TSV 160 to one or more bonding pads, which may be used for external connection.

Insulation layer 182 includes an electrically insulating material. In some embodiments, insulation layer 182 is and/or includes a passivation layer, which may include a material that is different than ILD layers of insulation layer 120-1' and/or insulation layer 120-1. In some embodiments, the passivation layer includes polyimide, undoped silicate glass (USG), silicon oxide, silicon nitride, other suitable passivation material, or combinations thereof. In some embodiments, a dielectric constant of the passivation layer is greater than a dielectric constant of ILD layers of insulation layer 120-1' and/or insulation layer 120-1. In some embodiments, the passivation layer has a multilayer structure having multiple dielectric materials. For example, the passivation layer may include a silicon nitride layer and a USG layer. In some embodiments, contact pads 188 are under-bump metallurgy/metallization (UBM) structures. RDL lines 184, RDL vias 186, and contact pads 188 include electrically conductive material, which may include aluminum, copper, titanium, tantalum, tungsten, ruthenium, cobalt, iridium, palladium, platinum, nickel, tin, gold, silver, other suitable metals, alloys thereof, silicides thereof, or combinations thereof. In some embodiments, RDL lines 184, RDL vias 186, contact pads, or combinations thereof include the same electrically conductive materials. In some embodiments, RDL lines 184, RDL vias 186, contact pads, or combinations thereof include different electrically conductive materials.

In some embodiments, TSV 160 is configured as a multipiece structure. For example, referring to FIG. 2, TSV 160 of stacked chip structure 100B is a two-piece TSV having a TSV portion 160A and a TSV portion 160B. In such embodiments, TSV 160 may be formed by more than one TSV fabrication process. Referring to FIG. 3E, an enlarged view of a Region III-2 of stacked chip structure 100B of FIG. 2 is provided that depicts a portion of TSV 160, according to some embodiments. In FIG. 2 and FIG. 3E, TSV portion 160A extends through insulation layer 120-1, substrate 206, insulation layer 120-1', and bonding layer 152, and TSV portion 160B extends through carrier substrate 150. TSV portion 160A has an electrically conductive core 174A, a barrier layer 176A, and a dielectric liner 178A, and TSV portion 160B has an electrically conductive core 174B, a barrier layer 176B, and a dielectric liner 178B. Electrically conductive core 174A is wrapped by barrier layer 176A, such that barrier layer 176A is disposed along a top and sidewalls of electrically conductive core 174A. Electrically conductive core 174B is wrapped by barrier layer 176B, such that barrier layer 176B is disposed along a top and sidewalls of electrically conductive core 174B. Barrier layer 176A is between dielectric liner 178A and electrically conductive core 174A, barrier layer 176A is between electrically conductive core 174A and metal line 122 of M(X-1) level, and dielectric liner 178A is between barrier layer 176A and insulation layer 120-1, substrate 106, insulation layer 120-1', and bonding layer 152. Barrier layer 176B is between dielectric liner 178B and electrically conductive core 174B, barrier layer 176B is between TSV portion 160A and electrically conductive core 174B, and dielectric liner 178B is between barrier layer 176B and carrier substrate 150. Thus, a top/frontside of TSV 160 is formed by barrier layer 176A, a bottom/backside of TSV 160 is formed by electrically conductive core 174B, barrier layer 174B, and dielectric liner 178B, and sidewalls of TSV 160 are formed by dielectric liner 178A and dielectric liner 178B. Further, barrier layer 176B is between electrically conductive plug 174A and electrically conductive plug 174B and between barrier layer 176A and electrically conductive plug 174B.

In FIG. 2 and FIG. 3E, each of TSV portion 160A and TSV portion 160B has a substantially vertical sidewall profile, TSV portion 160A has diameter D1 (and/or a width) (e.g., along the x-direction and/or the y-direction) that is substantially the same along its thickness (and/or its length) (e.g., along the z-direction), TSV portion 160B has a diameter D2 (and/or a width) (e.g., along the x-direction and/or the y-direction) that is substantially the same along its thickness (and/or its length) (e.g., along the z-direction), and diameter D2 is greater than diameter D1. In some embodiments, diameter D2 is the same as or less than diameter D1. In some embodiments, TSV portion 160A and/or TSV portion 160B has a circular shape in a top view, and TSV portion 160A and/or TSV portion 160B may be cylindrical structures. In some embodiments, TSV portion 160A and/or TSV portion 160B may have different shapes in a top view, such as a square shape, a rhombus shape, a trapezoidal shape, a hexagonal shape, an octagonal shape, or other suitable shape. In some embodiments, TSV portion 160A and TSV portion 160B may have different top views. For example, TSV portion 160A may have a circular shape in a top view, while TSV portion 160B may have a square shape or an octagonal shape in a top view, or vice versa. In some embodiments, diameter D1 (and/or the width) of TSV portion 160A varies along the thickness (and/or length) of TSV portion 160A. For example, TSV portion 160A may have a tapered sidewall profile (i.e., tapered sidewalls), and diameter D1 (and/or the width) of TSV portion 160A decreases or increases along the thickness (and/or length) of TSV portion 160A. In some embodiments, diameter D2 (and/or the width) of TSV portion 160B varies along the thickness (and/or length) of TSV portion 160B. For example, TSV portion 160B may have a tapered sidewall profile (i.e., tapered sidewalls), and diameter D2 (and/or the width) of TSV portion 160B decreases or increases along the thickness (and/or length) of TSV portion 160B. The present disclosure contemplates TSV portion 160A and/or TSV portion 160B having various sidewall profile configurations, such that TSV portion 160A may have various variations of diameter D1 along its thickness and/or TSV portion 160B may have various variations of diameter D2 along its thickness.

In stacked chip structure 100A (FIG. 1) and stacked chip structure 100B (FIG. 2), insulation layer 120-1, insulation layer 120-1', and insulation layer 120-2 each include a dielectric material, such as silicon oxide, tetraethylorthosilicate (TEOS) oxide, phosphosilicate glass (PSG), boron-doped silicate glass (BSG), boron-doped PSG (BPSG), low-k dielectric material (having, for example, a dielectric constant that is less than a dielectric constant of silicon oxide (e.g., $k<3.9$)), other suitable dielectric material, or combinations thereof. Exemplary low-k dielectric materials include fluorosilicate glass (FSG), carbon-doped oxide, xerogel, aerogel, amorphous fluorinated carbon, parylene, benzocyclobutene (BCB), polyimide, other low-k dielectric material, or combinations thereof. In some embodiments, insulation layer 120-1, insulation layer 120-1', insulation layer 120-2, or combinations thereof include a low-k dielectric material, such as carbon-doped oxide, or an extreme low-k dielectric material (e.g., $k<2.5$), such as porous carbon-doped oxide. Dielectric layer 118, dielectric layer 134, dielectric layer 142, which may form a portion of insulation layer 120-1, and dielectric layer 146, which may form a portion of insulation layer 120-1', may include any suitable dielectric material and/or have a multilayer structure (e.g., ILD and CESL), such as described herein.

In some embodiments, insulation layer 120-1, insulation layer 120-1', insulation layer 120-2, or combinations thereof has a multilayer structure. For example, insulation layer 120-1, insulation layer 120-1', and insulation layer 120-2 may each include at least one ILD layer, at least one CESL disposed between respective ILD layers, and at least one CESL disposed between a respective ILD layer and device substrates (e.g., substrate 106 and/or substrate 108). In such embodiments, a material of the CESL is different than a material of the ILD layer. For example, where the ILD layer includes a low-k dielectric material that includes silicon and oxygen, the CESL may include silicon and nitrogen (e.g., silicon nitride, silicon oxynitride, silicon carbonitride, or combinations thereof) or other suitable dielectric material (e.g., metal nitride). The ILD layer may have a multilayer structure having multiple dielectric materials. The CESL may have a multilayer structure having multiple dielectric materials.

In some embodiments, each level of FMLI-1 structure (e.g., $2^{nd}$ level including M2 level and V2 level) includes a respective ILD layer and/or a respective CESL of insulation layer 120-1, and respective metal lines 122 and metal vias 124 are in the respective ILD layer and/or the respective CESL. In some embodiments, each level of BMLI-1 structure (e.g., $1^{st}$ level including BM1 level and BV1 level) includes a respective ILD layer and/or a respective CESL of insulation layer 120-2, and respective metal lines 122' and metal vias 124' are in the respective ILD layer and/or the respective CESL. In some embodiments, each level of FMLI-2 structure (e.g., Y1 level including MY level and VY level) includes a respective ILD layer and/or a respective CESL of insulation layer 120-2, and respective metal lines 126 and metal vias 128 are in the respective ILD layer and/or the respective CESL.

In some embodiments, M0 level to MX level of FMLI-1 structure may each include a respective ILD layer and/or a respective CESL, where respective metal lines 122 are in the respective ILD layer and/or the respective CESL. In some embodiments, BM0 level to BMZ level of BMLI-1 structure may each include a respective ILD layer and/or a respective CESL, where respective metal lines 122' are in the respective ILD layer and/or the respective CESL. In some embodiments, M0 level to MY level of FMLI-2 structure may each include a respective ILD layer and/or a respective CESL, where respective metal lines 126 are in the respective ILD layer and/or the respective CESL In some embodiments, V0 level to VX level of FMLI-1 structure may each include a respective ILD layer and/or a respective CESL, where respective metal vias 124 are in the respective ILD layer and/or the respective CESL. In some embodiments, BV0 level to BVZ level of BMLI-1 structure may each include a respective ILD layer and/or a respective CESL, where respective metal vias 124' are in the respective ILD layer and/or the respective CESL. In some embodiments, V0 level to VY level of FMLI-2 structure may each include a respective ILD layer and/or a respective CESL, where respective metal vias 128 are in the respective ILD layer and/or the respective CESL.

Further, in stacked chip structure 100A (FIG. 1) and stacked chip structure 100B (FIG. 2), metal lines 122, metal vias 124, metal lines 122', metal vias 124', metal lines 126, metal vias 128, source/drain contacts (e.g., frontside source/drain contacts 136 and backside source/drain contacts 144), source/drain vias (e.g., source/drain vias 138), gate contacts (e.g., gate contact 140), and power vias (e.g., power via 172) include an electrically conductive material, including for example, aluminum, copper, titanium, tantalum, tungsten, ruthenium, cobalt, iridium, palladium, platinum, nickel, tin, gold, silver, other suitable metals, alloys thereof, silicides thereof, or combinations thereof. In some embodiments, metal lines 122, metal vias 124, metal lines 122', metal vias 124', metal lines 126, metal vias 128, source/drain contacts, source/drain vias, gate contacts, power vias, or combinations thereof include a bulk metal layer (also referred to as a metal fill layer, a conductive plug, a metal plug, etc.). In some embodiments, metal lines 122, metal vias 124, metal lines 122', metal vias 124', metal lines 126, metal vias 128, source/drain contacts, source/drain vias, gate contacts, power vias, or combinations thereof include a barrier layer, an adhesion layer, other suitable layer, or combinations thereof disposed between the bulk metal layer and respective portion of a respective insulation layer. The barrier layer may include titanium, titanium alloy (e.g., TiN), tantalum, tantalum alloy (e.g., TaN), other suitable barrier material (e.g., a material that may prevent diffusion of metal constituents from the bulk metal layer into a surrounding dielectric), or combinations thereof. In some embodiments, metal lines 122, metal vias 124, metal lines 122', metal vias 124', metal lines 126, metal vias 128, source/drain contacts, source/drain vias, gate contacts, power vias, or combinations thereof include different metal materials. For example, lower metal lines 122 and/or metal vias 124 (as well as lower metal lines 122' and/or metal vias 124'), which are closer to device layer DL1, may include tungsten, ruthenium, cobalt, or combinations thereof, while higher lower metal lines 122 and/or metal vias 124 (as well as higher metal lines 122' and/or metal vias 124'), which are further away from device layer DL1, may include copper. In another example, lower metal lines 126 and/or metal vias 128, which are closer to device layer DL2, may include tungsten, ruthenium, cobalt, or combinations thereof, while higher lower metal lines 126 and/or metal vias 128, which are further away from device layer DL2, may include copper. In some embodiments, metal lines 122, metal vias 124, metal lines 122', metal vias 124', metal lines 126, metal vias 128, source/drain contacts, source/drain vias, gate contacts, power vias, or combinations thereof include the same metal materials.

Referring to FIGS. 5-14, FIGS. 5-14 are cross-sectional views of a workpiece 200, in portion or entirety, at various fabrication stages of forming an interconnect structure of a stacked chip structure, such as the interconnect structure of stacked chip structure 100A of FIG. 1, according to various aspects of the present disclosure. FIGS. 5-14 have been simplified for the sake of clarity to better understand the inventive concepts of the present disclosure. Additional features can be added in workpiece 200, and some of the features described below can be replaced, modified, or eliminated in other embodiments of workpiece 200.

Figure 5:
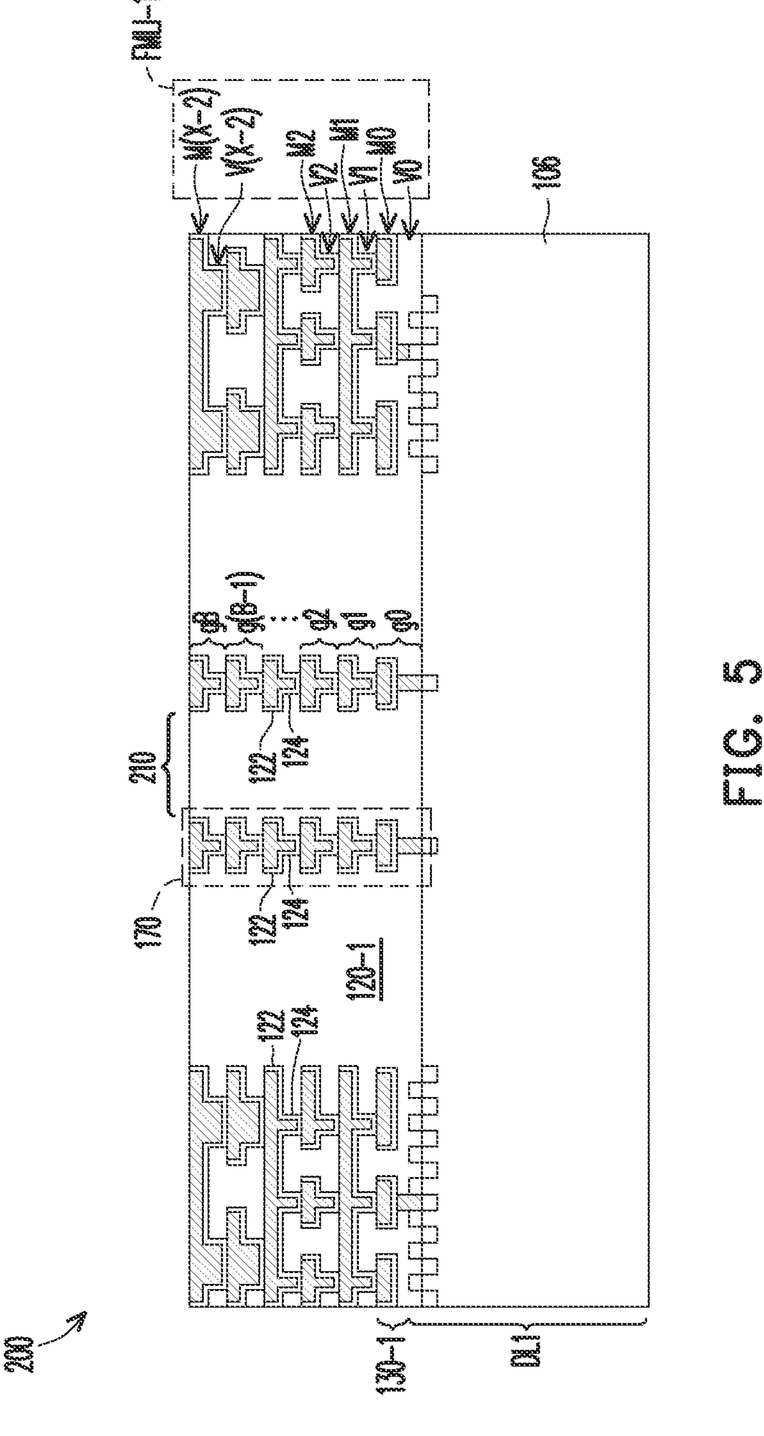
FIGS. 5-14 are cross-sectional views of a workpiece, in portion or entirety, at various fabrication stages of forming and interconnecting the stacked chip structure of FIG. 1, according to various aspects of the present disclosure.

Referring to FIG. 5, after workpiece 200 has undergone FEOL processing, workpiece 200 undergoes MEOL processing and BEOL processing to form a portion of FMLI-1 structure, such as M0 level to M(X-2) level and V0 level to V(X-2) level, over device layer DL1. FMLI-1 structure may be physically and/or electrically connected to devices, such as transistors (e.g., transistor T1 and/or transistor T2), of device layer DL1. Frontside interconnect structure stack of guard ring 170 (e.g., g0 level to gB level) may be formed over device layer DL1 while forming FMLI-1 structure. Frontside interconnect structure stack of guard ring 170 may be physically and/or electrically connected to device layer DL1, such as to source/drains in active regions thereof (FIG. 3B) and/or to power vias in isolation regions (e.g., STI regions) thereof (FIG. 3C). Guard ring 170 is an electrically conductive ring (e.g., a metal ring) (FIGS. 4A-4C) having an inner dimension that defines a dielectric region 210 of insulation layer 120-1. As described further below, TSV 160 is formed in and extends through dielectric region 210.

In some embodiments, forming a given level of FMLI-1 structure (e.g., metal vias 124 of V1 level and metal lines 122 of M1 level) and interconnect structures of guard ring 170 at the given level (e.g., metal vias 124 and metal lines 122 of g1 level) includes depositing a portion of insulation layer 120-1, such as depositing an ILD layer of insulation layer 120-1 over frontside of substrate 106. In some embodiments, depositing the portion of insulation layer 120-1 includes depositing a CESL before depositing the ILD layer, such that the ILD layer is deposited over the CESL. The portion of insulation layer 120-1 (e.g., the ILD layer and/or the CESL) are formed by chemical vapor deposition (CVD), plasma enhanced CVD (PECVD), high density plasma CVD (HDPCVD), flowable CVD (FCVD), physical vapor deposition (PVD), atomic layer deposition (ALD), metalorganic chemical vapor deposition (MOCVD), remote plasma CVD (RPCVD), low-pressure CVD (LPCVD), atomic layer CVD (ALCVD), atmospheric pressure CVD (APCVD), other suitable deposition method, or combinations thereof. A planarization process may be performed after depositing the portion of insulation layer 120-1.

In some embodiments, metal lines 122 and metal vias 124 of a given level of FMLI-1 structure (e.g., metal vias 124 of V1 level and metal lines 122 of M1 level) and interconnect structures of guard ring 170 at the given level (e.g., metal vias 124 and metal lines 122 of g1 level) are formed by a dual damascene process, which may involve depositing conductive material for via/metal line pairs at the same time. In such embodiments, metal vias 124 and metal lines 122 may share a barrier layer and a conductive plug, instead of each having a respective and distinct barrier layer and conductive plug (e.g., where a barrier layer of a respective metal line 122 separates a conductive plug of the respective metal line 122 from a conductive plug of its corresponding, respective metal via 124). In some embodiments, the dual damascene process includes performing a patterning process to form interconnect openings that extend through a portion of insulation layer 120-1 to expose underlying conductive features. The patterning process may include a first lithography step and a first etch step to form trench openings of the interconnect openings (which correspond with and define metal lines 122) in insulation layer 120-1 and a second lithography step and a second etch step to form via openings of the interconnect openings (which correspond with and define metal vias 124) in insulation layer 120-1. The first lithography/first etch step and the second lithography/second etch step may be performed in any order (e.g., trench first via last or via first trench last). The first etch step and the second etch step are each configured to selectively remove insulation layer 120-1 with respect to a patterned mask layer. The first etch step and the second etch step may be a dry etch, a wet etch, other suitable etching process, or combinations thereof.

After performing the patterning process, the dual damascene process may include performing a first deposition process to form a barrier material over insulation layer 120-1 that partially fills the interconnect openings and performing a second deposition process to form a bulk conductive material over the barrier material, where the bulk conductive material fills remainders of the interconnect openings. In such embodiments, the barrier material and the bulk conductive material are disposed in the interconnect openings and over a top surface of insulation layer 120-1. The first deposition process and the second deposition process can include CVD, PVD, ALD, HDPCVD, MOCVD, RPCVD, PECVD, LPCVD, ALCVD, APCVD, PEALD, electroplating, electroless plating, other suitable deposition method, or combinations thereof. A CMP process and/or other planarization process is then performed to remove excess bulk conductive material and barrier material from over a top surface of the portion of insulation layer 120-1, resulting in the patterned via layer (e.g., metal vias 124) and the patterned metal layer (e.g., metal lines 122) of the given level of FMLI-structure and corresponding interconnect structure of guard ring 170. The CMP process planarizes top surfaces of insulation layer 120-1 and metal lines 122. The barrier material and the bulk conductive material may fill the trench openings and the via openings of the interconnect openings without interruption, such that barrier layers and conductive plugs of metal lines 122 and metal vias 124 may each extend continuously from metal lines 122 to respective metal vias 124 without interruption.

In some embodiments, for a given level of FMLI-1 structure, metal lines 122 and metal vias 124 of an interconnect structure of the guard ring 170 at the given level are formed simultaneously with the metal lines 122 and metal vias 124, respectively, of the given level of FMLI-1 structure. In some embodiments, for a given level of FMLI-1 structure, metal lines 122 and metal vias 124 of an interconnect structure of the guard ring 170 at the given level are formed at least partially simultaneously with metal lines 122 and metal vias 124, respectively, of the given level of FMLI-1 structure. In some embodiments, for a given level of FMLI-1 structure, metal lines 122 and metal vias 124 of an interconnect structure of the guard ring 170 at the given level are formed by different processes than metal lines 122 and metal vias 124, respectively, of the given level of FMLI-1 structure. In some embodiments, for a given level of FMLI-1 structure, metal lines 122 and metal vias 124 of an interconnect structure of the guard ring 170 at the given level and metal lines 122 and/or metal vias 124, respectively, of the given level of FMLI-1 structure are formed by the same single damascene process. In some embodiments, for a given level of FMLI-1 structure, metal lines 122 and metal vias 124 of an interconnect structure of the guard ring 170 at the given level and metal lines 122 and/or metal vias 124, respectively, of the given level of FMLI-1 structure are formed by different single damascene processes. In some embodiments, for a given level of FMLI-1 structure, metal lines 122 and metal vias 124 of an interconnect structure of the guard ring 170 at the given level and metal lines 122 and/or metal vias 124, respectively, of the given level of FMLI-1 structure are formed by the same dual damascene process. In some embodiments, for a given level of FMLI-1 structure, metal lines 122 and metal vias 124 of an interconnect structure of the guard ring 170 at the given level and metal lines 122 and/or metal vias 124, respectively, of the given level of FMLI-1 structure are formed by different dual damascene processes.

Figure 6:
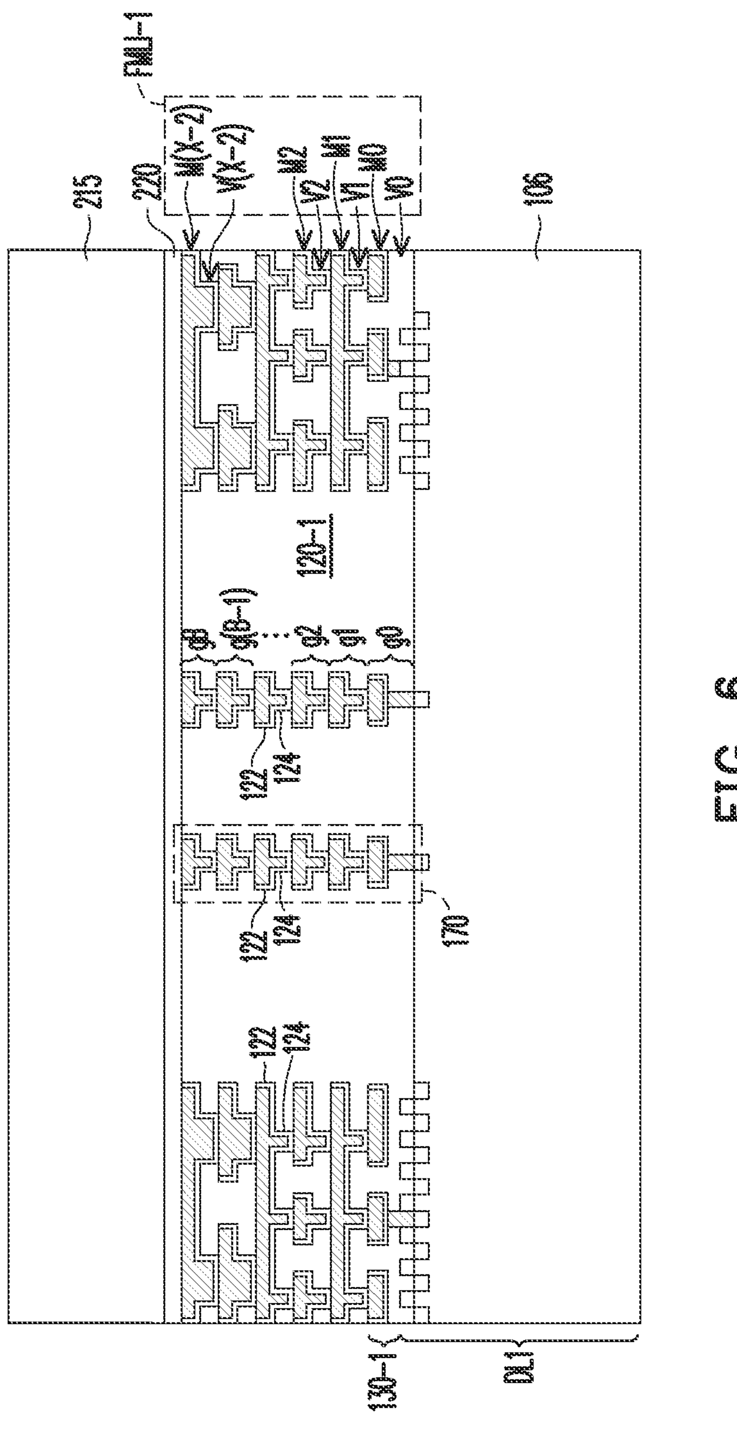

Referring to FIG. 6, a carrier substrate (wafer) 215 is attached to a frontside of workpiece 200, which allows workpiece 200 to be flipped over so that workpiece 200 is accessible from its backside for further processing. Carrier substrate 215 may be attached to workpiece 200 with any suitable attaching processes, such as direct bonding, hybrid bonding, using adhesive, other bonding and/or attachment processes, or combinations thereof. In the depicted embodiment, carrier substrate 215 is attached to a top surface of FMLI-1 structure by a bonding layer 220. The bonding process may include alignment, annealing, other processes, or combinations thereof. In some embodiments, carrier substrate 215 is a silicon substrate.

Figure 7:
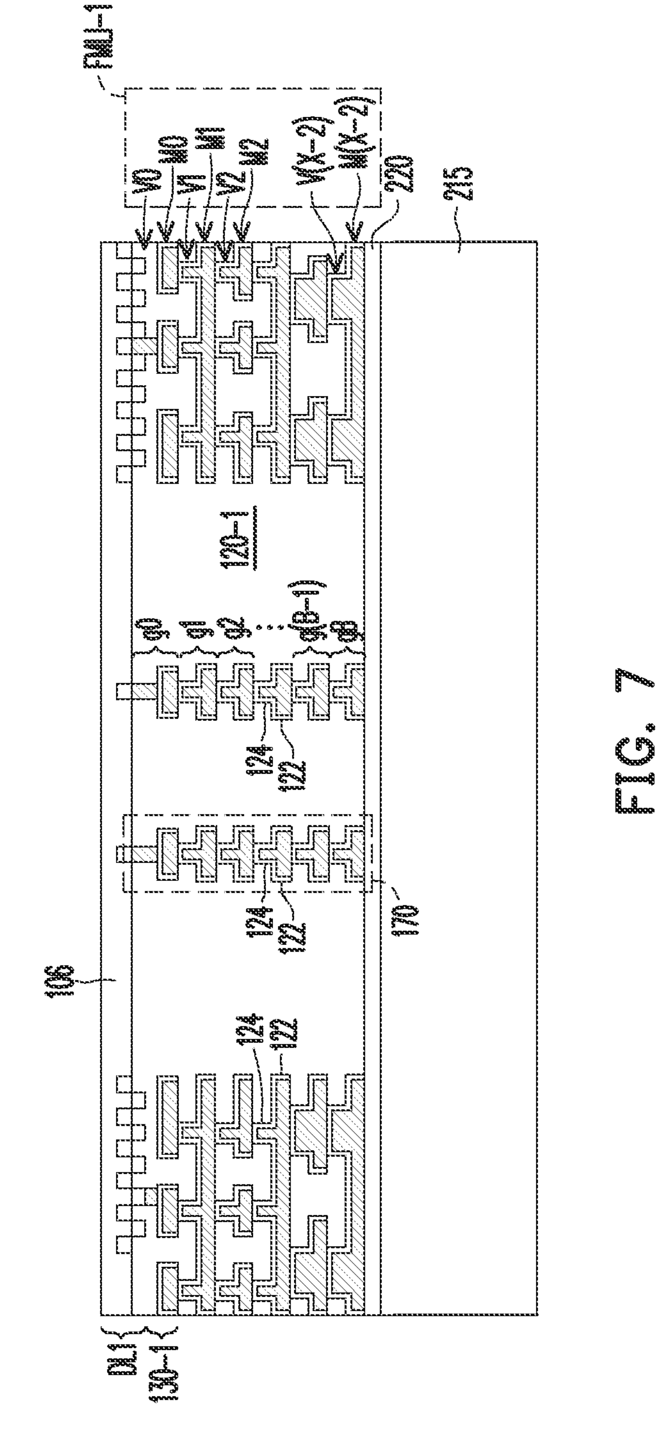

Referring to FIG. 7, workpiece 200 is flipped over and a thinning process is applied to a backside of substrate 106 of device layer DL1. The thinning process reduces a thickness of substrate 106 (e.g., along the z-direction), and in some embodiments, removes a majority of substrate 106 (e.g., a semiconductor substrate) of device layer DL1. The thinning process is a grinding process, a planarization process (e.g., CMP), an etching process, other suitable process, or combinations thereof. In some embodiments, the thinning process is a multistep process, such as a mechanical grinding process to remove a substantial amount of substrate 106 and then a chemical thinning process (e.g., using an etching chemical) to further thin substrate 106.

Figure 8:
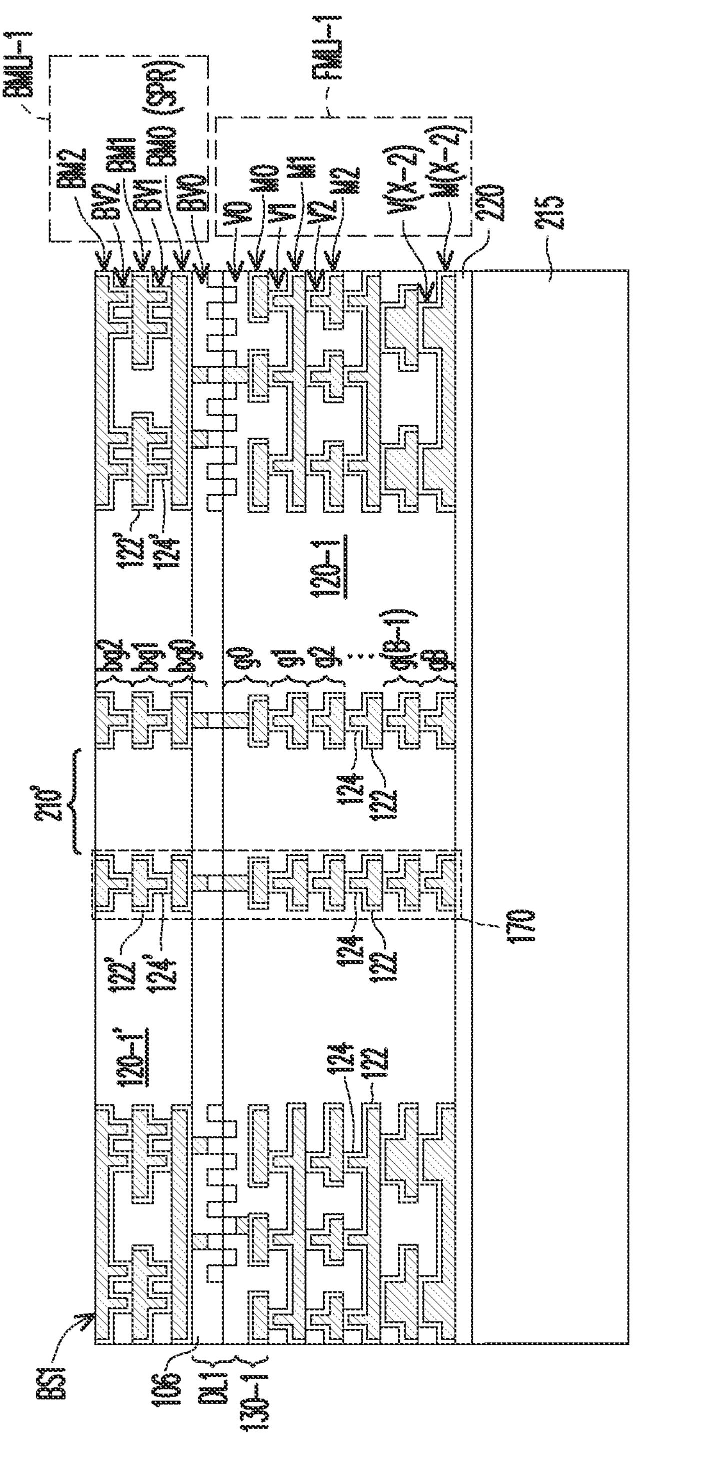

Referring to FIG. 8, BMLI-1 structure, such as BM0 level to BM2 level and BV0 level to BV2 level, is formed over a backside of device layer DL1. BMLI-1 structure may be physically and/or electrically connected to devices, such as transistors (e.g., transistor T1 and/or transistor T2), of device layer DL1. Backside interconnect structure stack of guard ring 170 (e.g., bg0 level to bg2 level) may be formed over device layer DL1 while forming BMLI-1 structure. Backside interconnect structure stack of guard ring 170 may be physically and/or electrically connected to device layer DL1, such as to source/drains in active regions thereof (FIG. 3B) and/or to power vias in isolation regions (e.g., STI regions) thereof (FIG. 3C). An inner dimension of backside interconnect structure stack defines a dielectric region 210' of insulation layer 120-1', and as described further below, TSV 160 is formed in and extends through dielectric region 210'. Formation of insulation layer 120-1', metal lines 122', and metal vias 124' of BMLI-1 structure and/or backside interconnect structure stack of guard ring 170 are similar to formation of insulation layer 120-1, metal lines 122, metal vias 124, and frontside interconnect structure stack of guard ring 170 described above in association with FIG. 5. Notably, in FIG. 8, a bottom via level of BMLI-1 structure (e.g., backside source/drain contacts, backside source/drain vias, topmost vias thereof, power vias, etc.) may be formed in substrate 106 (e.g., in an insulative portion thereof), and a device-level ILD layer of insulation layer 120-1' (i.e., on backside of substrate 106) includes metal lines 122' corresponding to a backside metal layer (e.g., BM0 level). Accordingly, BM0 level of BMLI-1 structure is formed directly on backside of substrate 106, while M0 level of FMLI-1 structure is separated from frontside of substrate 106 by V0 level (e.g., having source/drain vias, gate contacts, source/drain contacts, or combinations thereof) disposed in a respective ILD layer and/or a respective CESL.

Figure 9:
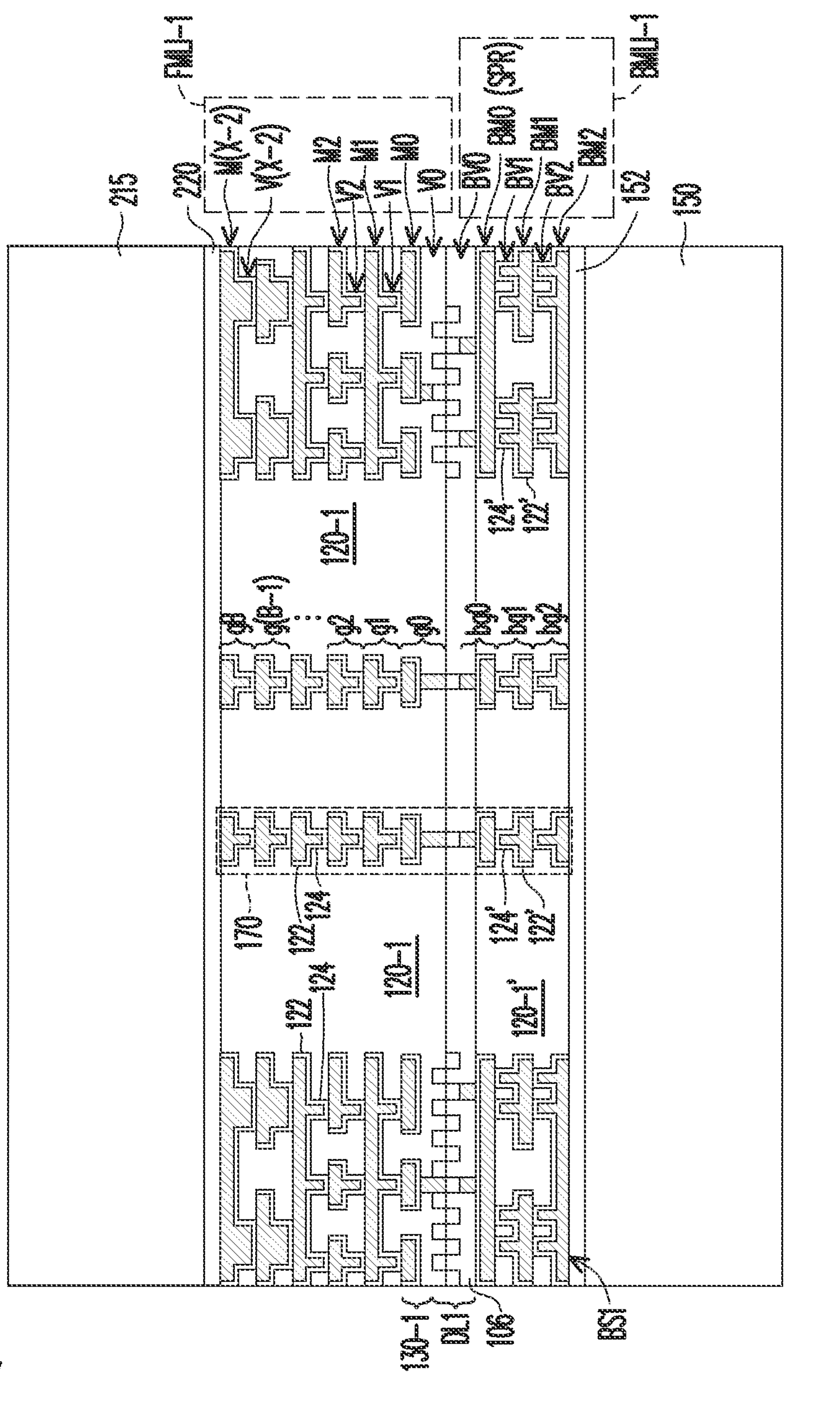

Referring to FIG. 9, carrier substrate 150 is attached to a backside of workpiece 200, such as BMLI-1 structure thereof, and workpiece 200 is flipped back over so that workpiece 200 is accessible from its frontside for further processing. Carrier substrate 150 may be attached to BMLI-1 structure with any suitable attaching processes, such as direct bonding, hybrid bonding, using adhesive, other bonding and/or attachment processes, or combinations thereof. In the depicted embodiment, carrier substrate 150 is attached to a bottom, backside surface of BMLI-1 structure by bonding layer 152 (e.g., an oxide layer), and a top, frontside surface of BMLI-1 structure is attached to a bottom, backside surface of substrate 106. The bonding process may include alignment, annealing, other processes, or combinations thereof.

Figure 10:
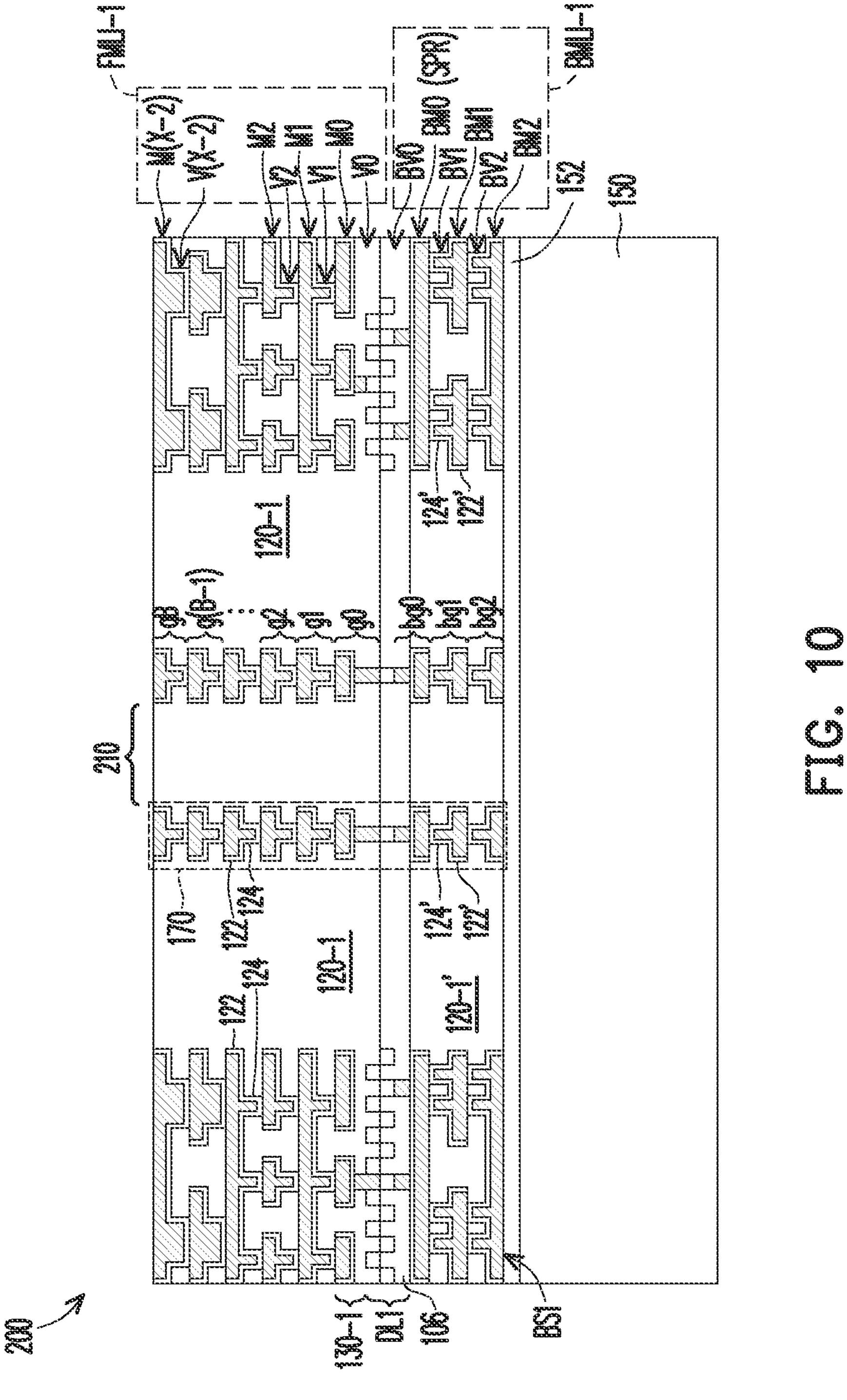
Figure 11:
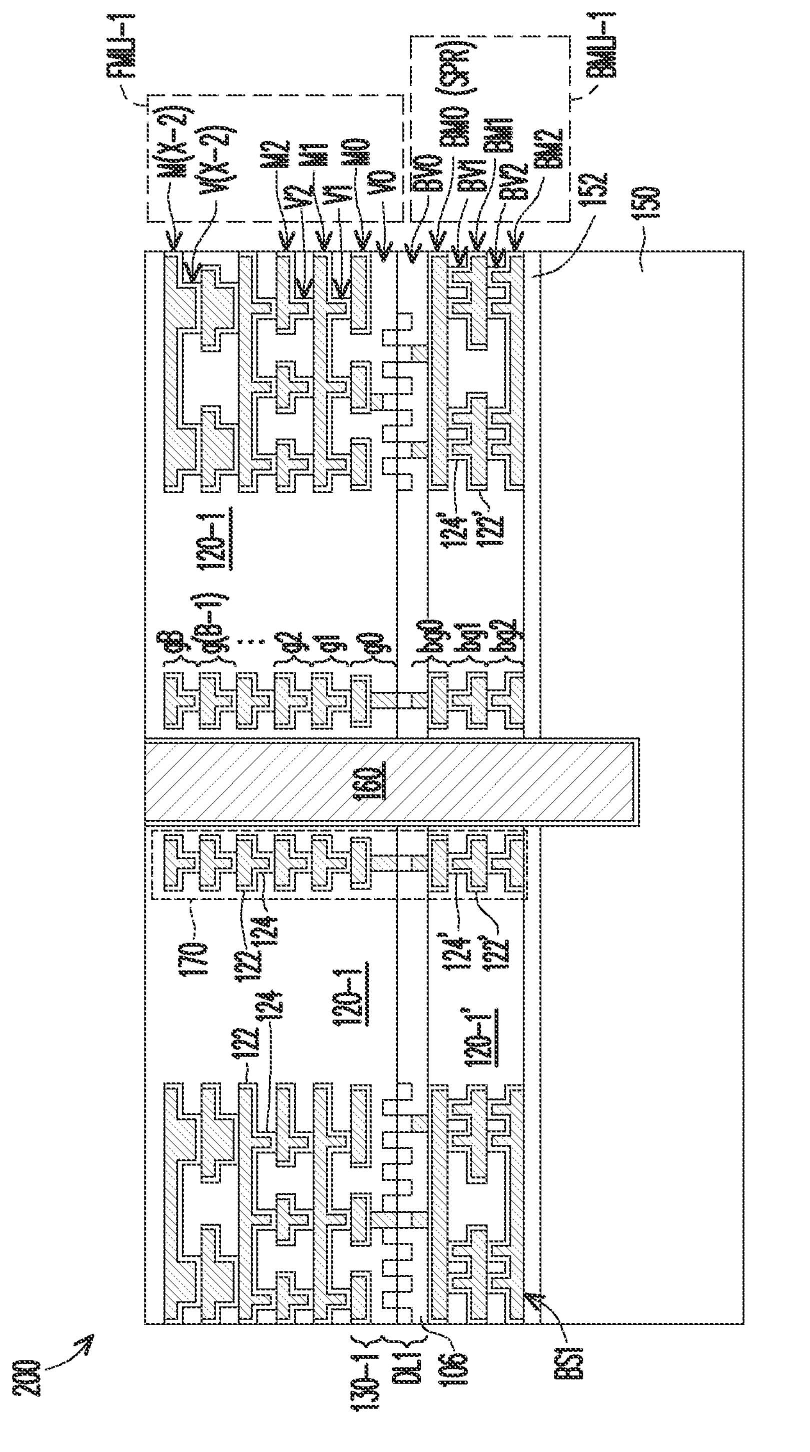

Referring to FIG. 10, carrier substrate 215 and bonding layer 220 are removed by a suitable process, such as a grinding process, from the frontside of workpiece 200 to expose FMLI-1 structure. Referring to FIG. 11, fabrication proceeds with forming TSV 160 by a suitable process. Forming TSV 160 may include forming one or more dielectric layers of insulation layer 120-1 (e.g., a CESL and/or an ILD layer) over M(X-2) level and forming a TSV trench that extends through insulation layer 120-1, device layer DL1 (e.g., substrate 106 thereof), insulation layer 120-1', bonding layer 152, and partially into carrier substrate 150 (i.e., the TSV trench extends a depth into carrier substrate 150 that is less than a thickness of carrier substrate 150). The TSV trench is formed in dielectric region 210 of insulation layer 120-1 and dielectric region 210' of insulation layer 120-1', such that guard ring 170 is around the TSV trench.

In some embodiments, forming the TSV trench includes forming a patterned mask layer having an opening therein that exposes dielectric region 210' of insulation layer 120-1 and etching an exposed portion of insulation layer 120-1, device layer DL1 (e.g., substrate 106 thereof), insulation layer 120-1', bonding layer 152, and carrier substrate 150 using the patterned mask layer as an etch mask. The patterned mask layer may be formed using a lithography process, which may include resist coating (e.g., spin-on coating), soft baking, mask aligning, exposure, post-exposure baking, developing the resist, rinsing, drying (e.g., hard baking), other suitable process, or combinations thereof. In some embodiments, the patterned mask layer is a patterned hard mask layer (e.g., a patterned silicon nitride layer). In some embodiments, the patterned mask layer is a patterned resist layer. The etching may be a dry etching process, a wet etching process, other etching process, or combinations thereof. In some embodiments, the etching process is an isotropic dry etch. In some embodiments, a Bosch process is implemented to extend the TSV trench through insulation layer 120-1, device layer DL1 (e.g., substrate 106 thereof), insulation layer 120-1', bonding layer 152, and partially into carrier substrate 150. A Bosch process generally refers to a high-aspect ratio plasma etching process that involves alternating etch phases and deposition phases, where a cycle includes an etch phase and a deposition phase and the cycle is repeated until the TSV trench has a desired depth.

Forming TSV 160 may further include filling the TSV trench with an electrically conductive material. In some embodiments, filling the TSV trench includes depositing a dielectric material (e.g., SiN, SiCN, and/or oxide) over the frontside of workpiece 200 that partially fills the TSV trench, depositing a barrier material (e.g., Ti, TiN, and/or TaN) over the dielectric material that partially fills the TSV trench, depositing a bulk electrically conductive material (e.g., Cu) over barrier material that fills a remainder of the TSV trench, and performing a planarization process (e.g., CMP) that removes excess dielectric material, barrier material, and bulk electrically conductive material from over a top surface of insulation layer 120-1. Insulation layer 120-1 (e.g., an ILD layer thereof) may function as a planarization stop layer, and the planarization process may be performed until reaching and exposing insulation layer 120-1. A remainder of the dielectric material forms dielectric liner 178, a remainder of barrier material forms barrier layer 176, and a remainder of the bulk electrically conductive material forms electrically conductive core/pillar 174. The dielectric material is formed by CVD (e.g., PECVD and/or LPCVD), thermal oxidation, chemical oxidation, other suitable deposition process, or combinations thereof. The barrier material is formed by PVD, CVD, ALD, other suitable deposition process, or combinations thereof. The electrically conductive bulk material is formed by electrochemical plating (ECP), electroplating, electroless plating, PVD, CVD, other suitable deposition process, or combinations thereof. In some embodiments, the dielectric material and the barrier material are conformally deposited over workpiece 200, such that the dielectric material and the barrier material have substantially uniform thicknesses. In some embodiments, the electrically conductive bulk material is blanket deposited over workpiece 200.

Figure 12:
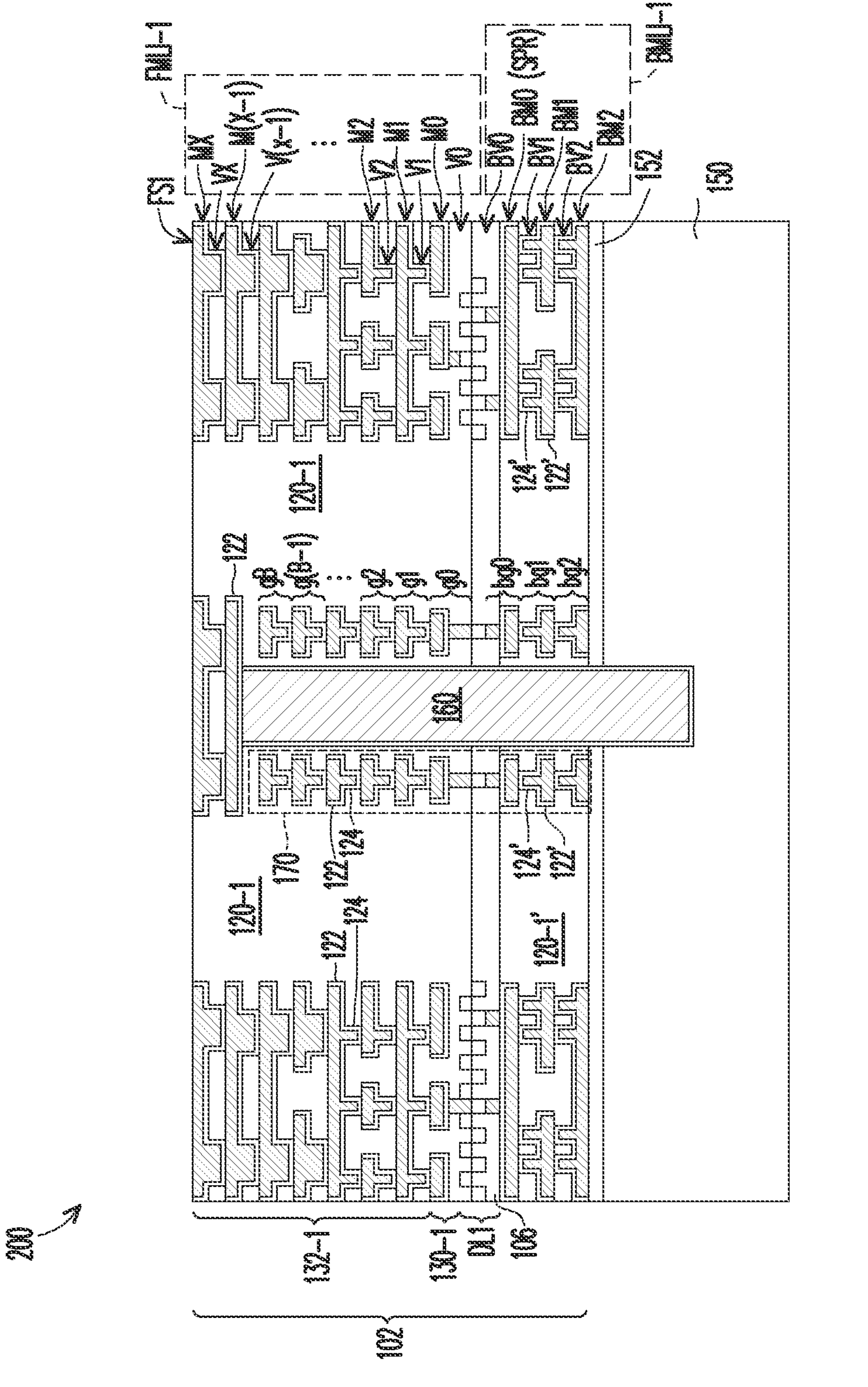

Referring to FIG. 12, processing includes forming a remainder of FMLI-1 structure, such as M(X-1) level to MX level and V(X-1) level to VX level. For example, additional dielectric layers of insulation layer 120-1 are formed over M(X-2) level and TSV 160, and metal vias 124 of V(X-1), metal lines 122 of M(X-1) level, metal vias 124 of VX level, and metal lines 122 of MX level are formed in the additional dielectric layers. MX level is fabricated with a bonding pitch, such as pitch P, that is smaller than an RDL bonding pitch. In device regions, metal vias 124 of V(X-1) level physically and electrically connect metal lines 122 of M(X-2) level to M(X-1) level. In contrast, TSV regions are free of metal vias 124 in V(X-1) level. Otherwise, guard ring 170 may short to TSV 160 through metal line 122 of M(X-1) level, which is physically and electrically connected to TSV 160. The present disclosure contemplates TSV 160 physically contacting a metal line 122 in other levels of FMLI-1 structure.

Figure 13:
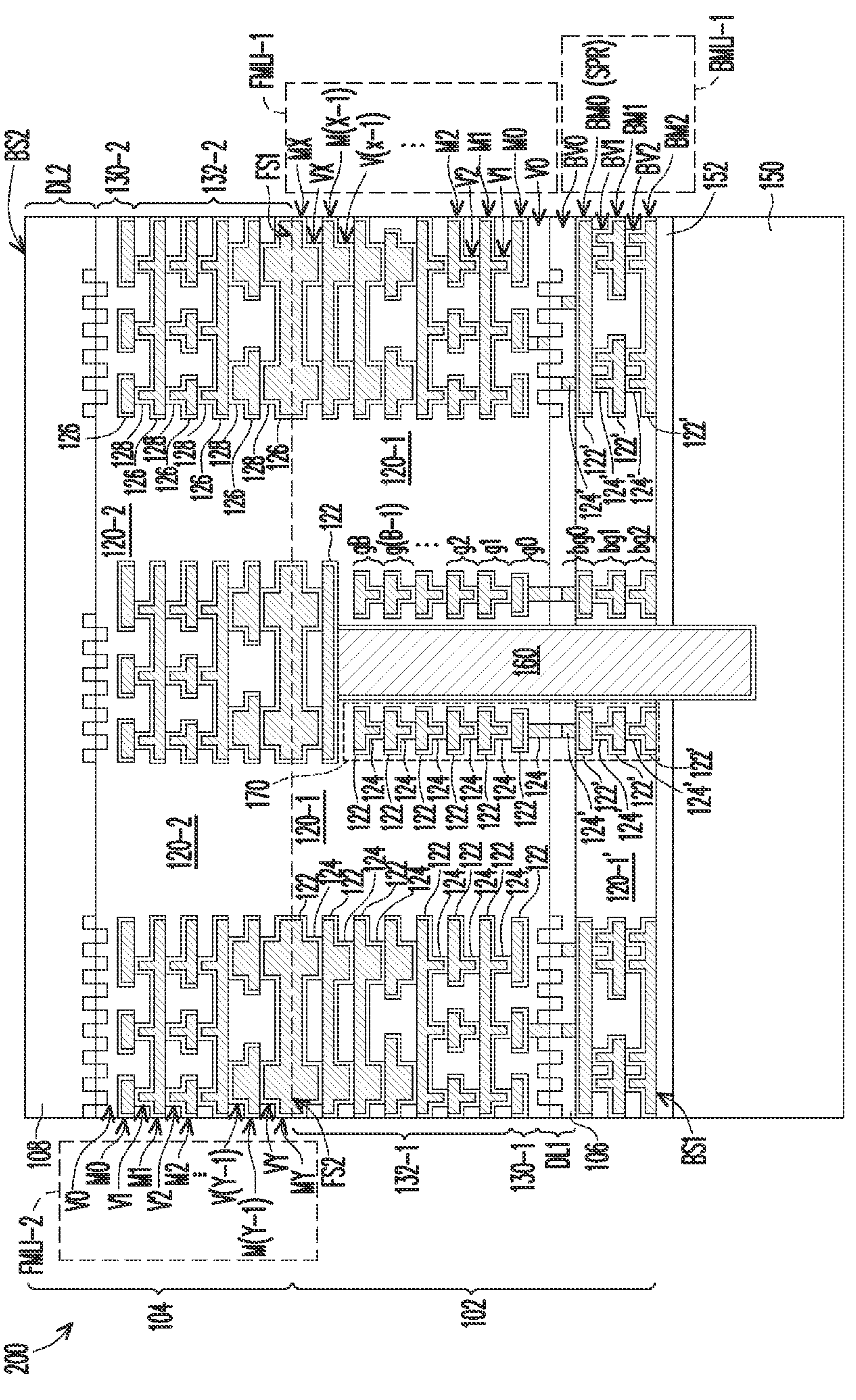

Referring to FIG. 13, chip 104 is face-to-face bonded (attached) with chip 102 to form stacked chip structure 100A, such as an SoIC, which may be an IC package or portion thereof. For example, MY layer of FMLI-2 structure of chip 104 is bonded to MX layer of FMLI-structure 1 of chip 102. MY level is fabricated with a bonding pitch, such as pitch P, that is the same as the bonding pitch of MX level and that is smaller than an RDL bonding pitch. Stacked chip structure 100A thus has a smaller bonding pitch than RDL bonding pitch, such as that implemented in stacked chip structures that indirectly face-to-face bond chip 102 and chip 104 through frontside RDL structures having the RDL bonding pitch.

Figure 14:
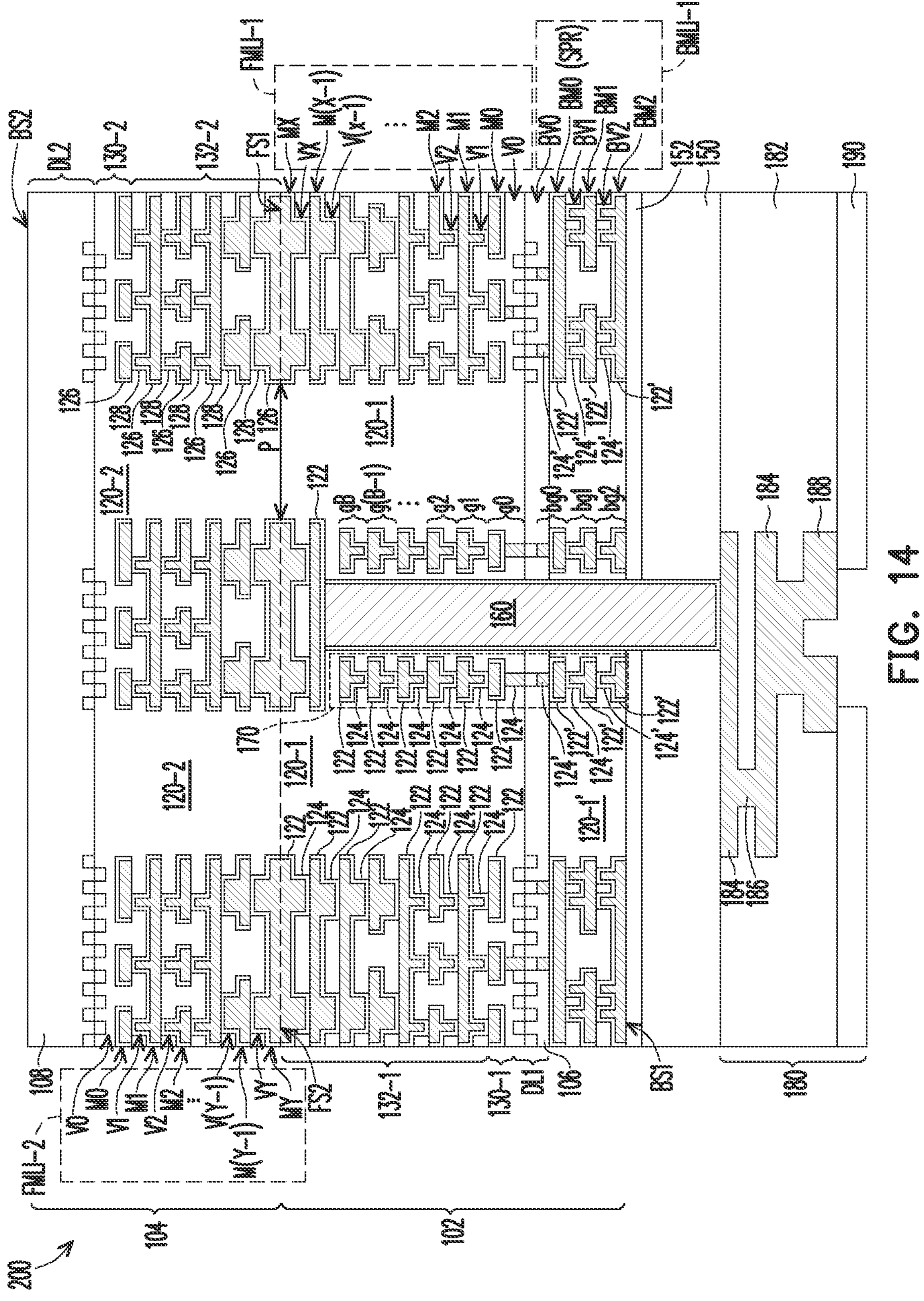
Figure 15:
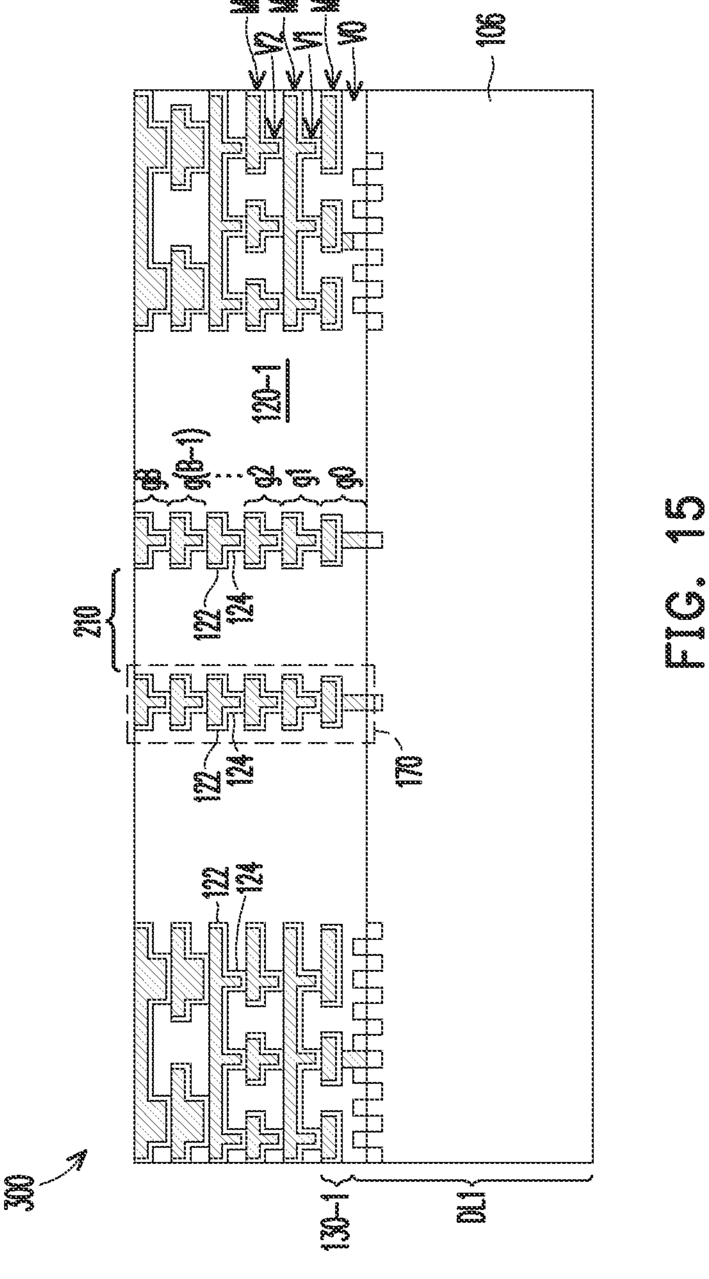
FIGS. 15-25 are cross-sectional views of a workpiece, in portion or entirety, at various fabrication stages of forming and interconnecting the stacked chip structure of FIG. 2, according to various aspects of the present disclosure.
Figure 16:
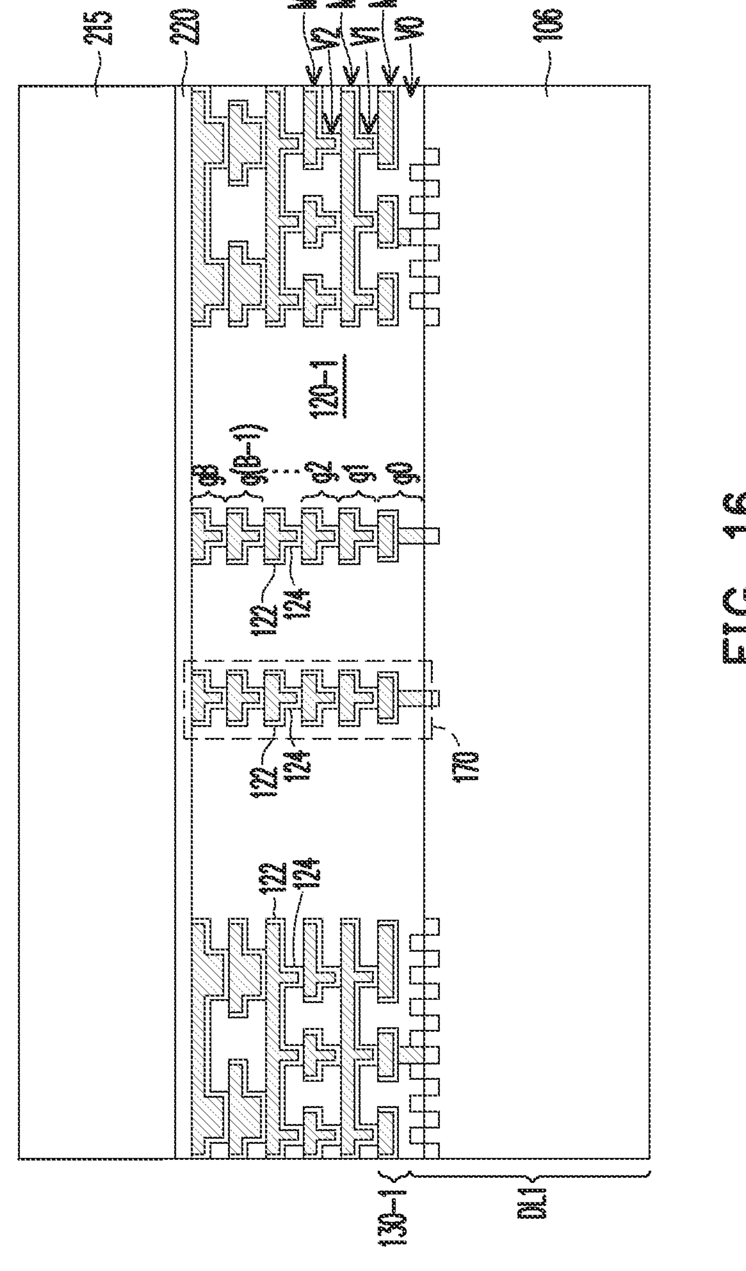
Figure 17:
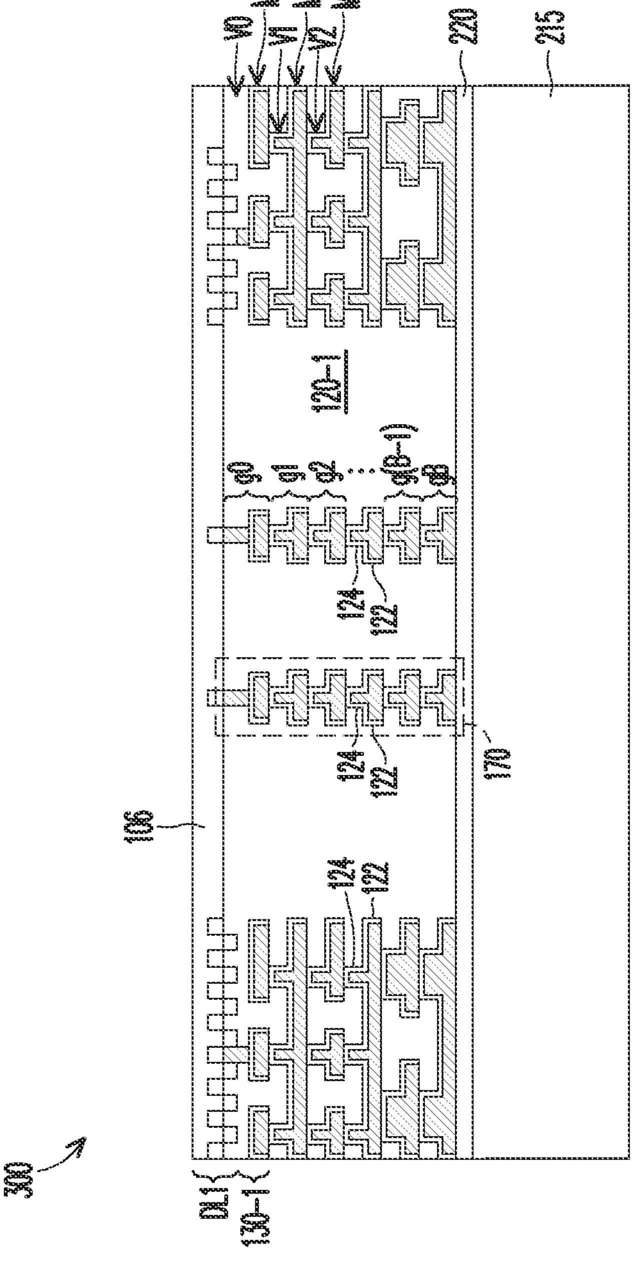

Referring to FIG. 14, a thinning process is applied to a backside of carrier substrate 150 to expose TSV 160, and processing may then proceed with forming RDL structure 180 over the backside of carrier substrate 150, such that device layer DL2 (e.g., substrate 108 thereof) forms a top, frontside of stacked chip structure 100A and RDL structure 180 forms a bottom, backside of stacked chip structure 100A. TSV 160 may thus facilitate electrical connection to and/or electrical communication of chip 102 and/or chip 104 with external circuitry through RDL structure 180. The thinning process reduces the thickness of carrier substrate 150 (e.g., along the z-direction), such that TSV 160 extends through carrier substrate 150. The thinning process is a grinding process, a planarization process (e.g., CMP), an etching process, other suitable process, or combinations thereof. In some embodiments, the thinning process is a planarization process that may stop upon reaching TSV 160 (e.g., barrier layer 176 thereof).

Referring to FIGS. 15-25, FIGS. 15-25 are cross-sectional views of a workpiece 300, in portion or entirety, at various fabrication stages of forming an interconnect structure of a stacked chip structure, such as the interconnect structure of stacked chip structure 100B of FIG. 2, according to various aspects of the present disclosure. FIGS. 15-25 have been simplified for the sake of clarity to better understand the inventive concepts of the present disclosure. Additional features can be added in workpiece 300, and some of the features described below can be replaced, modified, or eliminated in other embodiments of workpiece 300.

Figure 18:
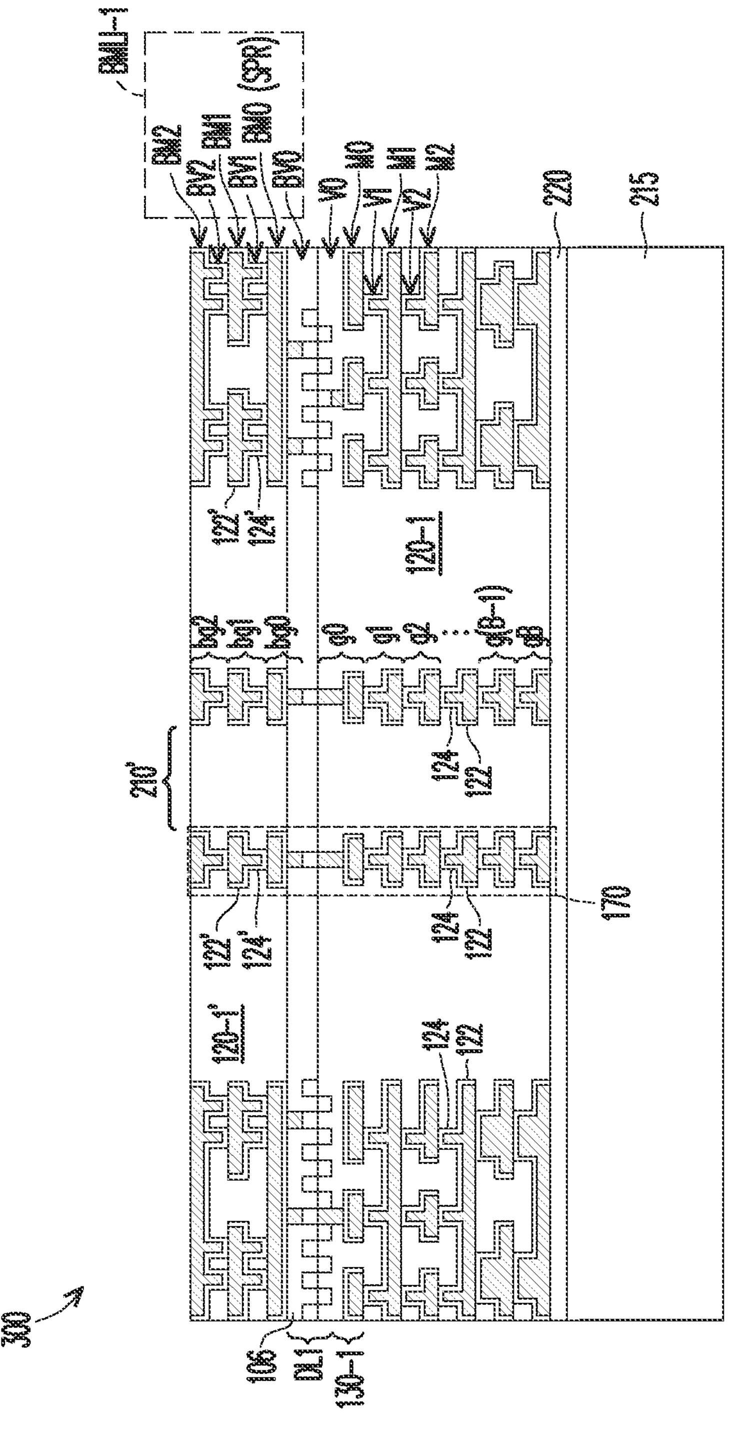

Fabrication of stacked chip structure 100B is similar to fabrication of stacked chip structure 100A. Accordingly, similar aspects therebetween are not repeated in the interest of simplicity and conciseness. Referring to FIGS. 15-18, workpiece 300 undergoes processing similar to that described above with reference to FIGS. 5-8, respectively. For example, a portion of FMLI-1 structure (including frontside interconnect structure stack of guard ring 170) is formed over frontside of device layer DL-1 (FIG. 15), a thinning process is applied to a backside of device layer DL-1 to reduce a thickness of substrate 106 (FIG. 16 and FIG. 17), and BMLI-1 structure (including backside interconnect structure stack of guard ring 170) is formed over backside of device layer DL-1 (FIG. 18).

Figure 19:
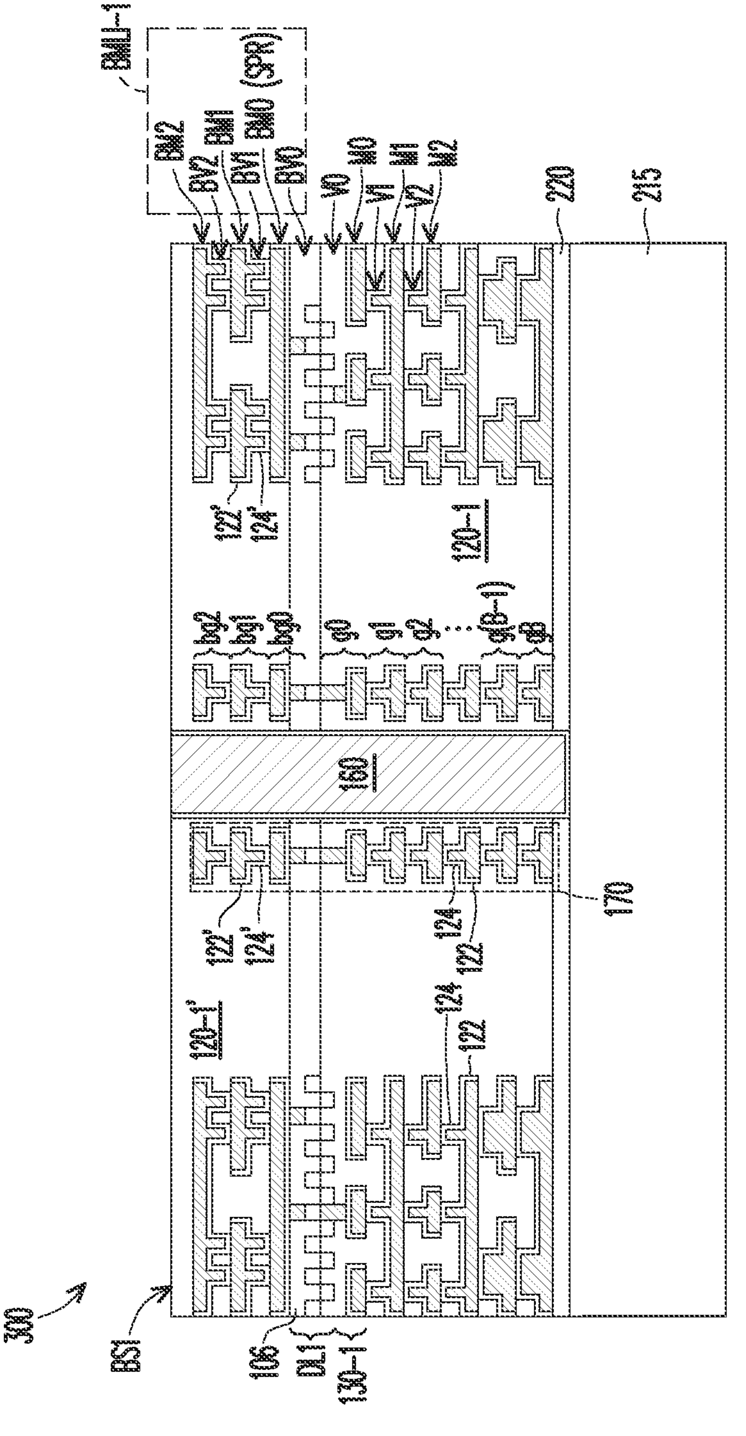

Referring to FIG. 19, fabrication proceeds with forming TSV portion 160A by a suitable process, which may be referred to as a backside TSV process. Forming TSV portion 160A may include forming one or more dielectric layers of insulation layer 120-1' (e.g., a CESL and/or an ILD layer) over BM2 level of BMLI-1 structure and forming a first TSV trench that extends through insulation layer 120-1', device layer DL1 (e.g., substrate 106 thereof), insulation layer 120-1, and bonding layer 220. The first TSV trench thus extends to and stops at carrier substrate 215. The first TSV trench is formed in dielectric region 210 of insulation layer 120-1 and dielectric region 210' of insulation layer 120-1', such that guard ring 170 is around the first TSV trench. In some embodiments, forming the first TSV trench includes forming a patterned mask layer having an opening therein that exposes dielectric region 210' of insulation layer 120-1' and etching an exposed portion of insulation layer 120-1', device layer DL1 (e.g., substrate 106 thereof), insulation layer 120-1, and bonding layer 220 using the patterned mask layer as an etch mask. Forming TSV 160A may further include filling the first TSV trench with an electrically conductive material. In some embodiments, filling the first TSV trench includes depositing a dielectric material (e.g., SiN, SiCN, and/or oxide) over the backside of workpiece 300 that partially fills the first TSV trench, depositing a barrier material (e.g., Ti, TiN, and/or TaN) over the dielectric material that partially fills the first TSV trench, depositing a bulk electrically conductive material (e.g., Cu) over barrier material that fills a remainder of the first TSV trench, and performing a planarization process (e.g., CMP) that removes excess dielectric material, barrier material, and bulk electrically conductive material from over a bottom surface of insulation layer 120-1'. Insulation layer 120-1' (e.g., an ILD layer thereof) may function as a planarization stop layer, and the planarization process may be performed until reaching and exposing insulation layer 120-1'. A remainder of the dielectric material forms dielectric liner 178A, a remainder of barrier material forms barrier layer 176A, and a remainder of the bulk electrically conductive material forms electrically conductive core/pillar 174A.

Figure 20:
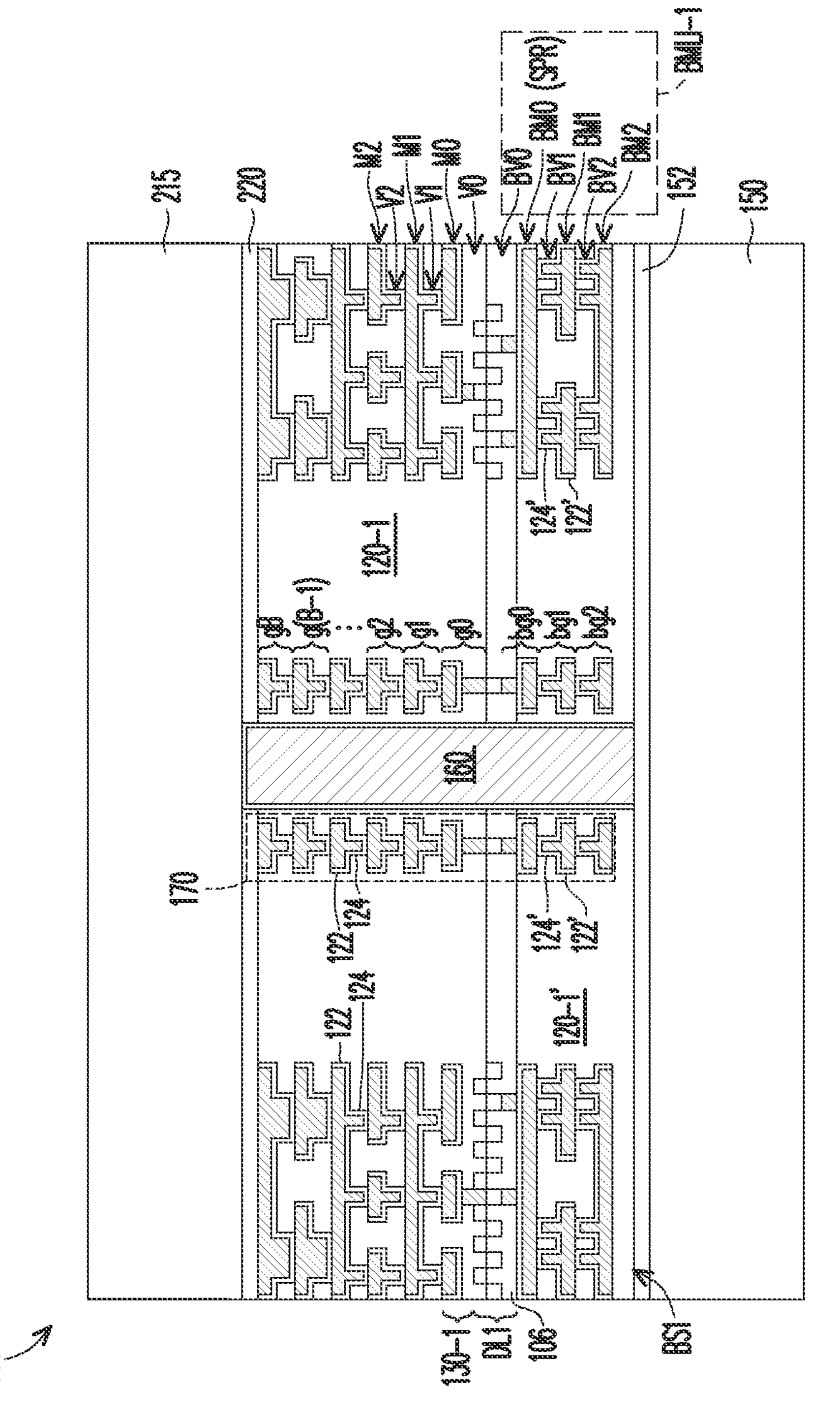
Figure 21:
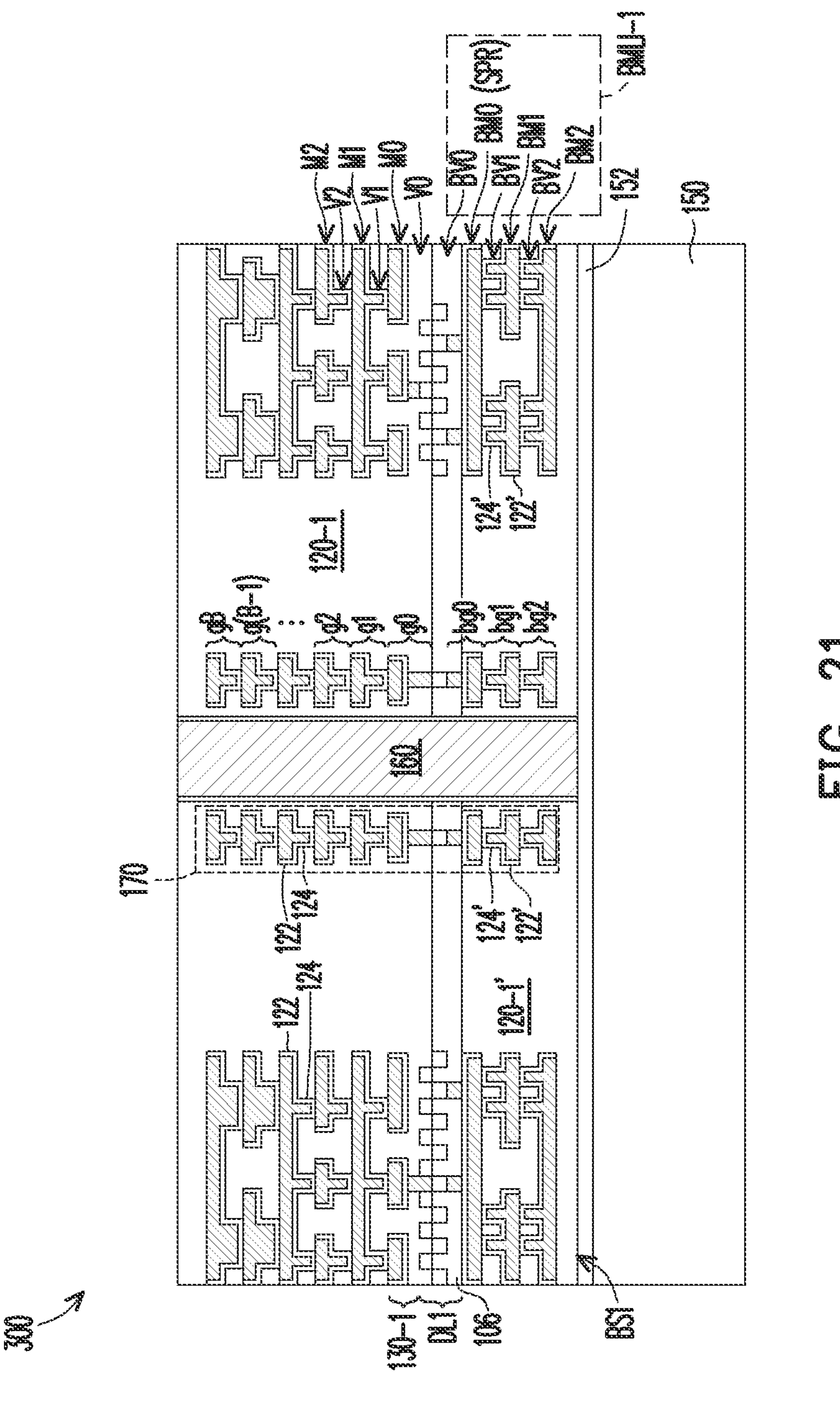

Referring to FIG. 20, carrier substrate 150 is attached to a backside of workpiece 300, such as BMLI-1 structure and TSV portion 160A thereof, and workpiece 300 is flipped back over so that workpiece 300 is accessible from its frontside for further processing. Carrier substrate 150 may be attached to BMLI-1 structure, such as described above with reference to FIG. 9. Thereafter, referring to FIG. 21, carrier substrate 215 and bonding layer 220 are removed by a suitable process, such as described above with reference to FIG. 10.

Figure 22:
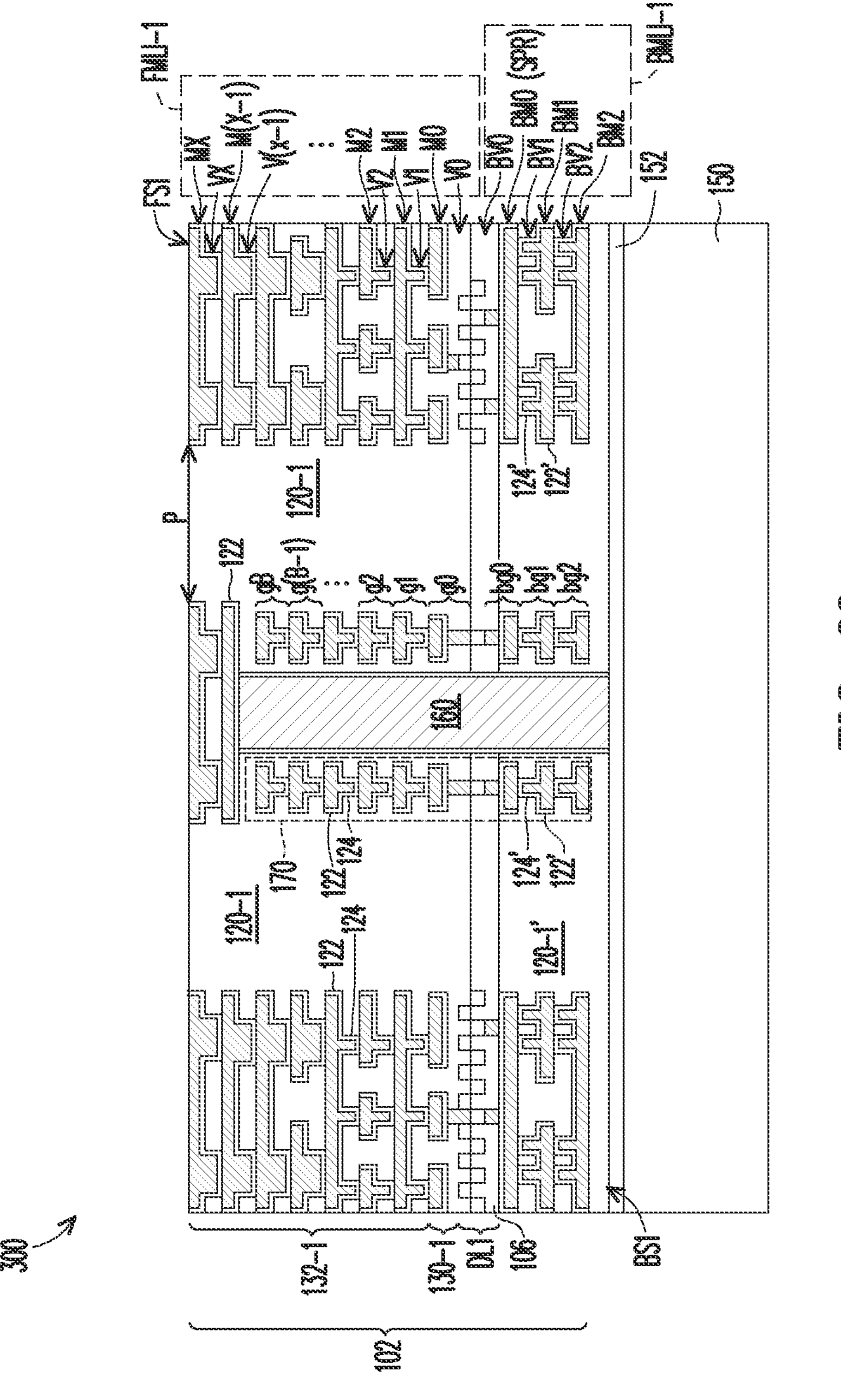

Referring to FIG. 22, fabrication proceeds with forming a remainder of FMLI-1 structure, such as M(X-1) level to MX level and V(X-1) level to VX level. For example, additional dielectric layers of insulation layer 120-1 are formed over M(X-2) level and TSV portion 160A, such as describe above with reference to FIG. 12. MX level is fabricated with a bonding pitch, such as pitch P, that is smaller than an RDL bonding pitch.

Figure 23:
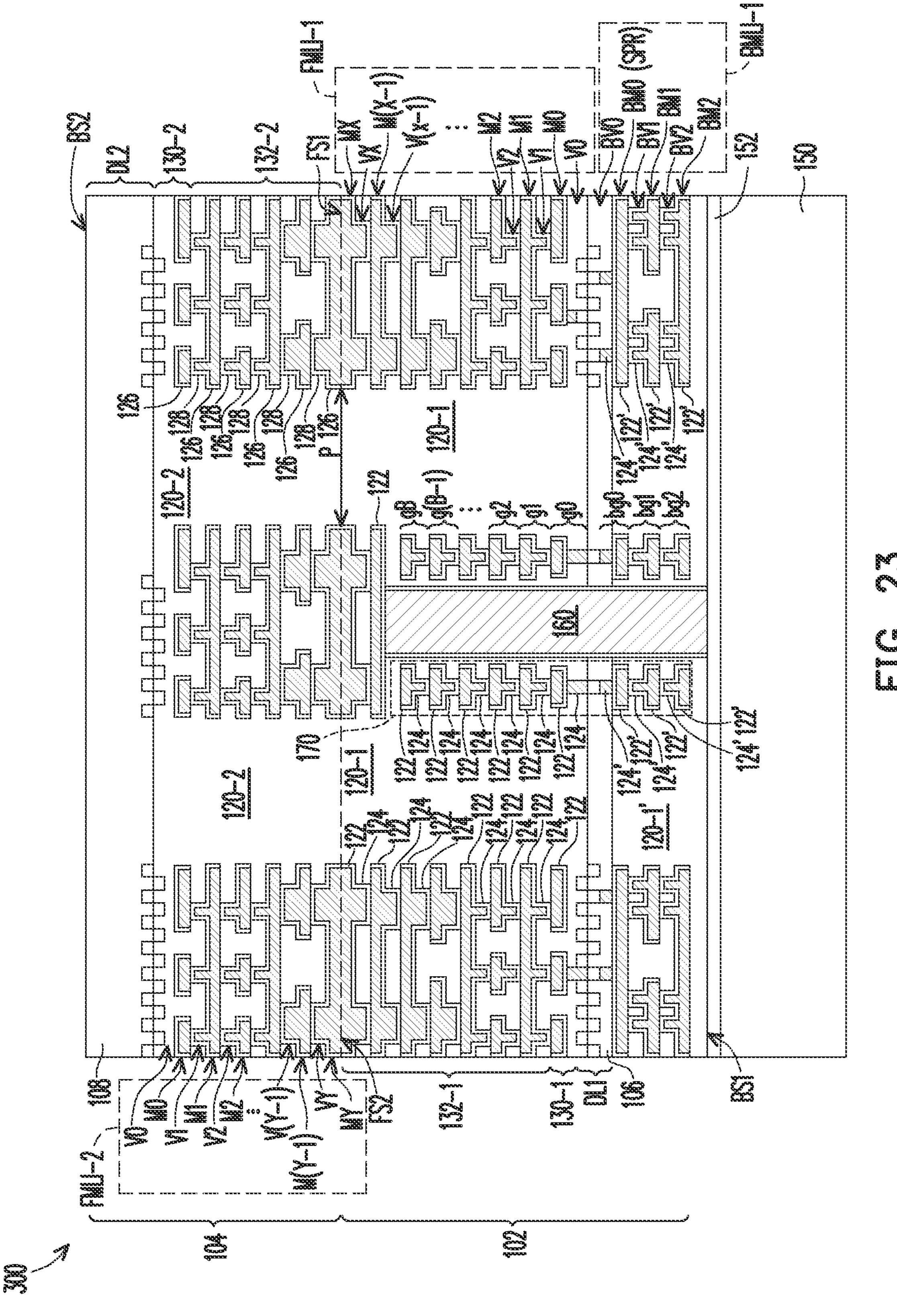

Referring to FIG. 23, chip 104 is face-to-face bonded with chip 102 to form stacked chip structure 100B, such as an SoIC, such as described above with reference to FIG. 13. For example, MY layer of FMLI-2 structure of chip 104 is bonded to MX layer of FMLI-structure 1 of chip 102. MY level is fabricated with a bonding pitch, such as pitch P, that is the same as the bonding pitch of MX level and that is smaller than an RDL bonding pitch. Stacked chip structure 100B thus has a smaller bonding pitch than RDL bonding pitch, such as that implemented in stacked chip structures that indirectly face-to-face bond chip 102 and chip 104 through frontside RDL structures having the RDL bonding pitch.

Figure 24:
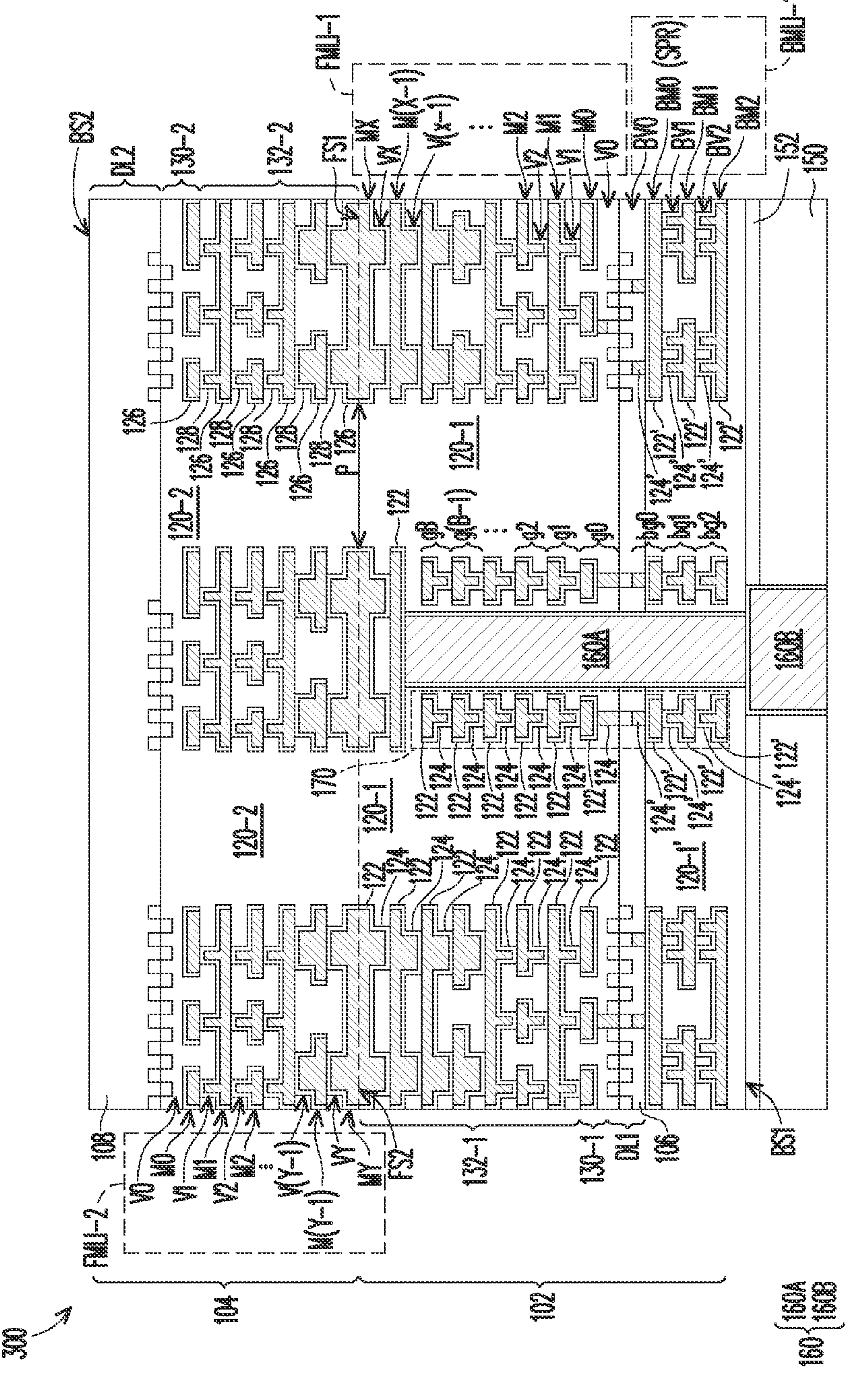

Referring to FIG. 24, processing further includes thinning carrier substrate 150 and forming TSV portion 160B in carrier substrate 150 (and bonding layer 152) by a suitable process, which may be referred to as a backside TSV process. Forming TSV portion 160B may include forming a second TSV trench that extends through carrier substrate 150 and bonding layer 152 and exposes TSV portion 160A. The second TSV trench thus extends to and stops at BMLI-1 structure and/or TSV portion 160A. Since the second TSV trench is formed in carrier substrate 150 and bonding layer 152, guard ring 170 is not around the second TSV trench, and guard ring 170 is thus not around TSV portion 160B. In some embodiments, forming the second TSV trench includes forming a patterned mask layer having an opening therein that a portion of carrier substrate 150 that overlaps trench portion 160A and etching an exposed portion of carrier substrate 150 and bonding layer 152 using the patterned mask layer as an etch mask. Forming TSV 160B may further include filling the second TSV trench with an electrically conductive material. In some embodiments, filling the second TSV trench includes depositing a dielectric material (e.g., SiN, SiCN, and/or oxide) over the backside of workpiece 300 that partially fills the second TSV trench, etching the dielectric material from a bottom of the second TSV trench (e.g., a dry etch to expose TSV portion 160A, such that dielectric material is not between electrically conductive portions of TSV portion 160A and TSV portion 160B), depositing a barrier material (e.g., Ti, TiN, and/or TaN) over the dielectric material that partially fills the second TSV trench, depositing a bulk electrically conductive material (e.g., Cu) over barrier material that fills a remainder of the second TSV trench, and performing a planarization process (e.g., CMP) that removes excess dielectric material, barrier material, and bulk electrically conductive material from over a backside surface of carrier substrate 150. Carrier substrate 150 may function as a planarization stop layer, and the planarization process may be performed until reaching and exposing carrier substrate 150. A remainder of the dielectric material forms dielectric liner 178B, a remainder of barrier material forms barrier layer 176B, and a remainder of the bulk electrically conductive material forms electrically conductive core/pillar 174B.

Figure 25:
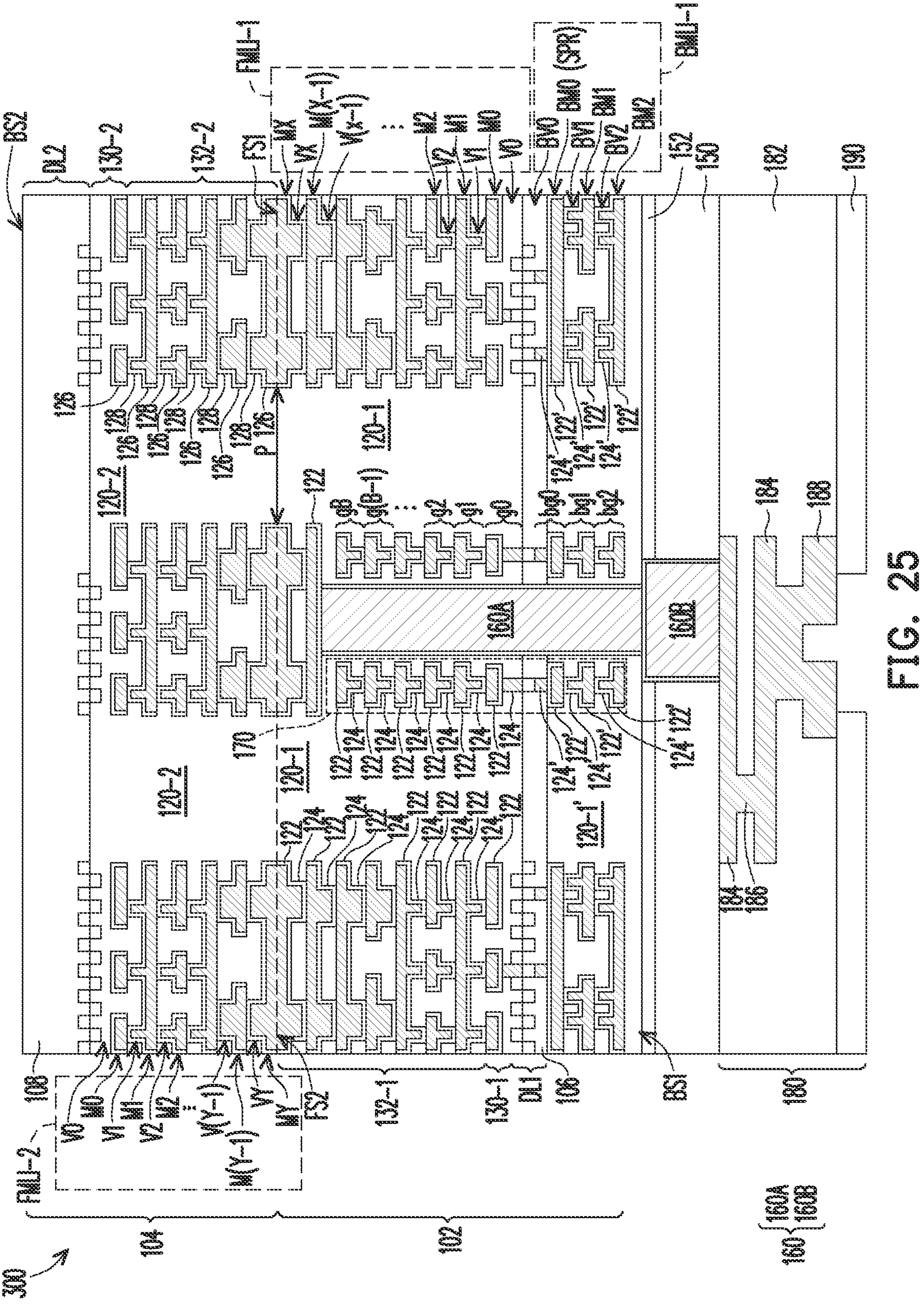

Referring to FIG. 25, processing may include forming RDL structure 180 over backside of carrier substrate 150, such as described herein, and TSV portion 160B may be physically connected to an electrically conductive portion of RDL structure 180.

Interconnect structures for front-to-front stacked chips/dies and methods of fabrication thereof are disclosed herein. The present disclosure provides for many different embodiments. An exemplary stacked chip structure includes a first chip having a first device substrate, a first frontside interconnect structure, and a backside interconnect structure. The first device substrate is disposed between the first frontside interconnect structure and the backside interconnect structure. The stacked chip structure further includes a second chip having a second device substrate and a second frontside interconnect structure disposed over the second device substrate. The second frontside interconnect structure is attached to the first frontside interconnect structure. The stacked chip structure further includes a carrier substrate attached to the backside interconnect structure. The stacked chip structure further includes a through via disposed in the first frontside interconnect structure. The through via extends from the first frontside interconnect structure through the first device substrate, the backside interconnect structure, and the carrier substrate. In some embodiments, the through via is connected to the first frontside interconnect structure and the second frontside interconnect structure.

In some embodiments, the stacked chip structure further includes a redistribution layer (RDL) structure attached to the carrier substrate, and the through via is connected to an electrically conductive portion of the RDL structure. In some embodiments, the backside interconnect structure is a power delivery network (PDN). In some embodiments, the first chip and the second chip are a portion of a system on integrated circuit (SoIC).

In some embodiments, the stacked chip structure further includes a guard ring around the through via. The guard ring extends through the first device substrate and the backside interconnect structure. In some embodiments, the guard ring is not disposed in the carrier substrate, and the guard ring is not around a portion of the through via in the carrier substrate. In some embodiments, the through via includes an electrically conductive core that extends from the first frontside interconnect structure through the first device substrate, the backside interconnect structure, and the carrier substrate without interruption. In such embodiments, the through via may include a barrier that wraps the electrically conductive core. In some embodiments, the through via includes an electrically conductive core having a first portion and a second portion. The first portion extends from the first frontside interconnect structure through the first device substrate and the backside interconnect structure, and the second portion extends through the carrier substrate. In such embodiments, the through via may include a first barrier that wraps the first portion and a second barrier that wraps the second portion.

An exemplary integrated circuit (IC) package includes a system on integrated circuit (SoIC) having a first die that is face-to-face bonded with a second die. A first topmost metallization layer of a first frontside multilayer interconnect of the first die is bonded to a second topmost metallization layer of a second frontside multilayer interconnect of the second die. The IC package further includes a through via that extends partially through the first frontside multilayer interconnect, through a device layer of the first die, through a backside power rail of the first die, and through a carrier substrate to a redistribution layer (RDL) structure. The backside power rail is between the carrier substrate and the device layer.

In some embodiments, each of the first topmost metallization layer and the second topmost metallization layer has a bonding pitch that is less than about 0.5 Å. In some embodiments, a first number of levels of the first frontside multilayer interconnect of the first die is greater than a second number of levels of the second frontside multilayer interconnect of the second die. In some embodiments, the backside power rail is formed directly on a backside of a semiconductor substrate of the device layer.

In some embodiments, the through via includes an electrically conductive core wrapped by a barrier layer, and the barrier layer is between the electrically conductive core and the RDL structure. In some embodiments, the through via includes a first through via portion having a first electrically conductive core wrapped by a first barrier layer and a second through via portion having a second electrically conductive core wrapped by a second barrier layer. The first barrier layer is between the first electrically conductive core and a metal line of the first frontside multilayer interconnect, and the second barrier layer is between the first electrically conductive core and the second electrically conductive core. In some embodiments, the second electrically conductive core and the second barrier layer physically contact the RDL structure.

An exemplary method includes directly bonding a first topmost metallization layer of a first frontside multilayer interconnect of a first chip to a second topmost metallization layer of a second frontside multilayer interconnect of a second chip. The method further includes bonding a carrier substrate to a backside multilayer interconnect of the first chip. A device layer of the first chip is between the backside multilayer interconnect of the first chip and the first frontside multilayer interconnect of the first chip. The method further includes forming a through via that extends partially through the first frontside multilayer interconnect, through the device layer, through the backside multilayer interconnect, and through the carrier substrate.

In some embodiments, the through via is formed by a frontside through via process that includes forming the through via after bonding the carrier substrate to the backside multilayer interconnect of the first chip. In some embodiments, the through via is formed by a backside through via process that includes forming a first portion of the through via before bonding the carrier substrate to the backside multilayer interconnect of the first chip and forming a second portion of the through via after bonding the carrier substrate to the backside multilayer interconnect of the first chip. In some embodiments, the method further includes forming a redistribution layer (RDL) structure over the carrier substrate, and the through via is connected to an electrically conductive portion of the RDL structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked chip structure comprising:

a first chip having a first device substrate, a first frontside interconnect structure, and a backside interconnect structure, wherein the first device substrate is disposed between the first frontside interconnect structure and the backside interconnect structure;

a second chip having a second device substrate and a second frontside interconnect structure disposed over the second device substrate, wherein the second frontside interconnect structure is attached to the first frontside interconnect structure;

a carrier substrate attached to the backside interconnect structure;

a through via disposed in the first frontside interconnect structure, wherein the through via extends from the first frontside interconnect structure through the first device substrate, the backside interconnect structure, and the carrier substrate; and a guard ring around the through via, wherein the guard ring extends through the first device substrate and the backside interconnect structure.

2. The stacked chip structure of claim 1, wherein the through via is connected to the first frontside interconnect structure and the second frontside interconnect structure.

3. The stacked chip structure of claim 1, wherein first metal lines of a first topmost metal level of the first frontside interconnect structure are bonded to respective second metal lines of a second topmost metal level of the second frontside interconnect structure.

4. The stacked chip structure of claim 1, wherein:

the guard ring is not disposed in the carrier substrate; and the guard ring is not around a portion of the through via in the carrier substrate.

5. The stacked chip structure of claim 1, wherein:

the through via includes an electrically conductive core that extends from the first frontside interconnect structure through the first device substrate, the backside interconnect structure, and the carrier substrate without interruption; and the through via includes a barrier that wraps the electrically conductive core.

6. The stacked chip structure of claim 1, wherein:

the through via includes an electrically conductive core having a first portion and a second portion, wherein the first portion extends from the first frontside interconnect structure through the first device substrate and the backside interconnect structure, and the second portion extends through the carrier substrate; and the through via includes a first barrier that wraps the first portion and a second barrier that wraps the second portion.

7. The stacked chip structure of claim 1, further comprising a redistribution layer (RDL) structure attached to the carrier substrate, wherein the through via is connected to an electrically conductive portion of the RDL structure.

8. The stacked chip structure of claim 1, wherein the backside interconnect structure is a power delivery network (PDN).

9. The stacked chip structure of claim 1, wherein the first chip and the second chip are a portion of a system on integrated circuit (SoIC).

10. An integrated circuit (IC) package comprising:

a system on integrated circuit (SoIC) having a first die that is face-to-face bonded with a second die, wherein a first topmost metallization layer of a first frontside multilayer interconnect of the first die is bonded to a second topmost metallization layer of a second frontside multilayer interconnect of the second die; and a through via that extends partially through the first frontside multilayer interconnect, through a device layer of the first die, through a backside power rail of the first die, and through a carrier substrate to a redistribution layer (RDL) structure, wherein the backside power rail is between the carrier substrate and the device layer, and further wherein the through via includes an electrically conductive core wrapped by a barrier layer, wherein the barrier layer is between the electrically conductive core and the RDL structure.

11. The IC package of claim 10, wherein each of the first topmost metallization layer and the second topmost metallization layer has a bonding pitch that is less than about 0.5 Å.

12. The IC package of claim 10, further comprising a guard ring around the through via, wherein the guard ring is disposed in the first frontside multilayer interconnect and the device layer of the first die.

13. The IC package of claim 12, wherein a length of the through via is greater than a length of the guard ring.

14. The IC package of claim 10, wherein the through via is electrically connected to the second frontside multilayer interconnect of the second die.

15. The IC package of claim 10, wherein a first number of levels of the first frontside multilayer interconnect of the first die is greater than a second number of levels of the second frontside multilayer interconnect of the second die.

16. The IC package of claim 10, wherein the backside power rail is formed directly on a backside of a semiconductor substrate of the device layer.

17. A method comprising:

directly bonding a first topmost metallization layer of a first frontside multilayer interconnect of a first chip to a second topmost metallization layer of a second frontside multilayer interconnect of a second chip;

bonding a carrier substrate to a backside multilayer interconnect of the first chip, wherein a device layer of the first chip is between the backside multilayer interconnect of the first chip and the first frontside multilayer interconnect of the first chip; and forming a through via that extends partially through the first frontside multilayer interconnect, through the device layer, through the backside multilayer interconnect, and through the carrier substrate, wherein the through via is formed by a frontside through via process that includes forming the through via after bonding the carrier substrate to the backside multilayer interconnect of the first chip.

18. The method of claim 17, wherein the forming the through via includes removing a portion of the carrier substrate to expose the through via.

19. The method of claim 17, wherein the through via is formed by a backside through via process that includes:

forming a first portion of the through via before bonding the carrier substrate to the backside multilayer interconnect of the first chip; and forming a second portion of the through via after bonding the carrier substrate to the backside multilayer interconnect of the first chip.

20. The method of claim 17, further comprising forming a redistribution layer (RDL) structure over the carrier substrate, wherein the through via is connected to an electrically conductive portion of the RDL structure.

* * * * *